(12) United States Patent
Ota

(10) Patent No.: US 6,699,630 B2
(45) Date of Patent: Mar. 2, 2004

(54) METHOD AND APPARATUS FOR EXPOSURE, AND DEVICE MANUFACTURING METHOD

(75) Inventor: Kazuya Ota, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/162,383

(22) Filed: Jun. 5, 2002

(65) Prior Publication Data

US 2002/0146628 A1 Oct. 10, 2002

Related U.S. Application Data

(63) Continuation of application No. 09/612,495, filed on Jul. 7, 2000.

(51) Int. Cl.[7] .............................. G03F 9/00; G03C 5/00
(52) U.S. Cl. ........................... 430/30; 430/22; 430/311
(58) Field of Search .............................. 430/22, 30, 311

(56) References Cited

U.S. PATENT DOCUMENTS

| 5,117,255 A | | 5/1992 | Shiraishi et al. ............... 355/53 |
|---|---|---|---|
| 5,448,333 A | | 9/1995 | Iwamoto et al. ............... 355/53 |
| 5,912,096 A | * | 6/1999 | Hada ............................ 430/30 |
| 6,087,053 A | * | 7/2000 | Hara ............................ 430/30 |
| 6,225,012 B1 | * | 5/2001 | Nishi et al. ................... 430/22 |
| 6,312,859 B1 | * | 11/2001 | Taniguchi ..................... 430/22 |

* cited by examiner

*Primary Examiner*—Christopher G. Young
(74) *Attorney, Agent, or Firm*—Oblon, Spivak, McClelland, Maier & Neustadt, P.C.

(57) ABSTRACT

On sequentially transferring patterns formed on a mask onto a plurality of divided areas on a substrate, when a new divided area on the substrate exposed, the substrate is moved from the exposure position of the preceding divided area to the exposure position of the new divided area in consideration of thermal expansion of the substrate at this stage. Thereafter, the mask pattern is transferred onto the predetermined divided area. With this process, exposure is performed with the respective shot areas arranged on the substrate at a desired interval in a cooled state after exposure. This makes it possible to improve the overlay accuracy with respect to the subsequent layer while performing exposure with high overlay accuracy with respect to the preceding layer.

28 Claims, 8 Drawing Sheets

Fig. 2
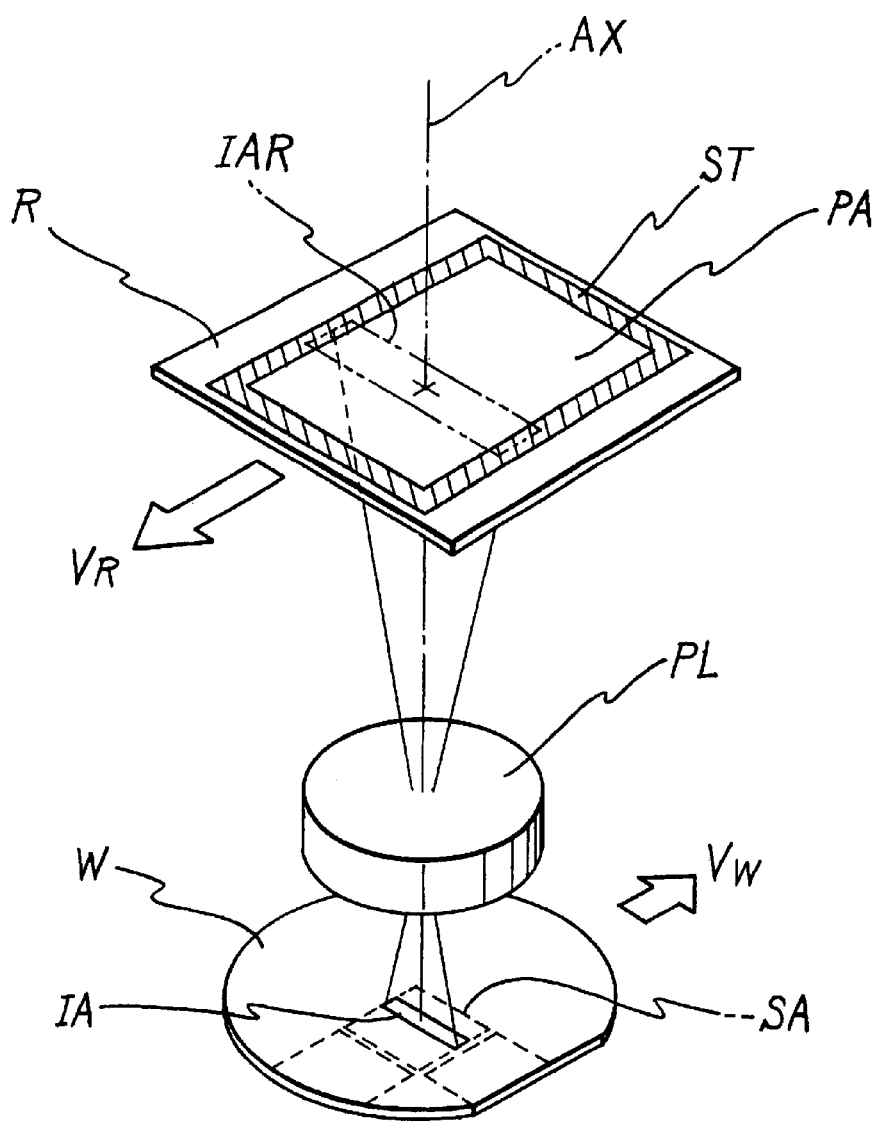
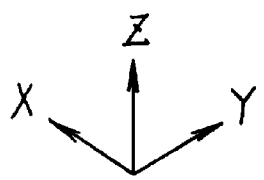

METHOD AND APPARATUS FOR EXPOSURE, AND DEVICE MANUFACTURING METHOD

BACKGROUND OF THE INVENTION

1. Field of the Invention

The present invention relates to an exposure method and apparatus, and device manufacturing method. More particularly, the present invention relates to an exposure method used when a semiconductor device, liquid crystal display device, or the like is manufactured in a lithographic process, an exposure apparatus to which the exposure method is applied, and a method of manufacturing devices such as semiconductor devices and liquid crystal display devices by using the exposure method or apparatus.

2. Description of the Related Art

Conventionally, in a lithographic process for manufacturing a semiconductor device, a liquid crystal display device, or the like, an exposure apparatus has been used. In such an exposure apparatus, patterns formed on a mask or reticle (to be generically referred to as a "reticle" hereinafter) are transferred through a projection optical system onto a substrate such as a wafer or glass plate (to be referred to as a "substrate or wafer" hereinafter, as needed) coated with a resist or the like.

As apparatus of this type, a static exposure type (also called a step-and-repeat method) reduction projection exposure apparatus (a so-called stepper) and a scanning exposure apparatus based on a step-and-scan method have been put into practice. The stepper is designed to repeat stepping operations which positions a wafer stage on which a wafer as a substrate is mounted to a predetermined exposure position by moving the stage two-dimensionally by a predetermined amount. And while the wafer stage is positioned, exposing operations of transferring a reticle pattern onto a shot area on the substrate through a projection optical system is repeated. The scanning exposure apparatus is an improvement of the stepper. This apparatus is designed to synchronously move a reticle stage holding a reticle and the wafer stage in a predetermined scanning direction with respect to the projection optical system while illuminating a predetermined slit-shaped area on the reticle with an illumination light. The overall reticle pattern is transferred onto the respective shot areas on the wafer by sequentially transferring the pattern formed on the reticle in the slit-shaped area, onto the wafer through the projection optical system.

In these exposure apparatus, shot areas are arranged on a wafer at predetermined intervals in rows and columns, in a shape of a matrix (no shot areas are actually formed on the first layer, but in this case virtual shot areas are included) are exposed in a predetermined sequence. As the predetermined sequence, from the view of the moving efficiency of the wafer stage in exposure, which leads to an improvement in the throughput of the apparatus, a so-called row zigzag method or column zigzag method is generally used. In this case, the row zigzag method is a method of the exposure apparatus exposing respective shot areas arranged on the wafer in the shape of a matrix by sequentially stepping in the X direction (or in the Y direction) by a predetermined amount along a row. And on exposing the next row, the apparatus sequentially performs stepping operation in a reverse direction (parallel and reverse direction to that on the preceding row). In the column zigzag method, the "rows" in the row zigzag method are respectively replaced with "columns", and "columns" with "rows". Accordingly, in this specification, the terms "row zigzag method" and "column zigzag method" are hereinafter used as in the meanings described above.

On exposing the second or subsequent layers, positioning (hereinafter to be referred to as alignment) of the circuit patterns on the shot areas formed on the wafer by exposure of the preceding layer and the reticle pattern is performed. Alignment methods include the die-by-die method and the enhanced global alignment (to be referred to as "EGA" hereinafter) method which details are disclosed in U.S. Pat. No. 4,780,617. In the die-by-die method alignment is performed shot by shot. Whereas, in the EGA method the alignment marks (positioning marks transferred together with circuit patterns) are measured at a plurality of positions within the wafer. The array coordinates are then obtained of the respective shot areas by the least-squares approximation or the like, and stepping is performed by using the calculated result in accordance with the precision of the wafer stage on exposure. Of these methods, the EGA method is widely used from the aspect of throughput of the apparatus.

With the conventional exposure apparatus, on changing a shot area subject to exposure, when the first layer is exposed, the stepping amount in the row direction is determined as an integer multiple of a predetermined row interval. And the stepping amount in the column direction is set to an integer multiple of a predetermined column interval. On exposure of the second or subsequent layer that uses the EGA scheme, the stepping amount is obtained from the calculation result of the EGA.

However, determining the stepping amount conventionally by using the EGA method limited the overlay accuracy between layers. This was because the wafer gradually expanded due to irradiation thermal energy on exposure.

That is, on exposing a shot area on a layer, thermal energy is generated by the reaction of the resist coated on the wafer or by the so-called excessive optical energy which did not serve as the energy for the reaction of the resist. As a result, the wafer temperature rises. Although some of the thermal energy generated dissipates from the wafer surface into the atmosphere, most of the thermal energy stays in the wafer. The remaining thermal energy conducts through the wafer, and to the wafer holder from the rear surface of the wafer. The thermal energy is gradually conducted through the wafer reaching the holder through the lower surface of the wafer. And, the thermal energy conducted to the wafer holder circulates within the wafer holder. That is, the wafer and the wafer holder are heated together. Furthermore, since the rear surface of the holder, i.e., the opposite surface side of the surface in contact with the wafer is in contact with the wafer stage, therefore, the thermal energy is also gradually transmitted to the wafer stage.

In this process, the balance of the energy gradually moves toward the tendency in which the thermal energy is stored in the wafer and wafer holder. More specifically, the wafer and the wafer holder gradually store the thermal energy, from the beginning of exposure on the first shot area (the first shot area) on a layer until exposure of the last shot area is completed. That is, the temperature of the wafer and wafer holder gradually rise, therefore, the wafer and wafer holder gradually expand. Since the linear expansion coefficient of a Si wafer is 2.4 ppm/k, a wafer having a diameter of 20 mm expands as large as 48 nm while the temperature rises 0.1° C.

Consequently, on exposure with a conventional exposure apparatus, in general, the intervals between adjacent shot areas in a cooled state after exposure become smaller than of the designed interval as the exposure sequence proceeds. As a result, the difference between the shot area intervals in a cooled state after exposure and the designed interval lose its uniformity on the substrate. In addition, depending on the exposure sequence such as the row zigzag method or column zigzag method, the state losing its uniformity varies.

In general, on forming a semiconductor circuit, a lithographic process of 20 or more layers is required, and in each processing the overlay accuracy with its preceding layer is significant. The alignment error described above, is, naturally, a factor of this overlay error. However, even if the alignment is successfully performed, there is no guarantee that overlay between layers will be successful. This is because the reticle on which the circuit pattern is drawn and which is used to form each layer differs in transmittance and reflectance depending on the shape of the pattern drawn, and hence the energy that reaches the wafer vary in level. In addition, the reflectance of the wafer surface may differ depending on the layers, as well as the resist coated on the wafer surface may differ in type, thickness, and the like. Accordingly, since the expansion amount of the wafer may differ depending on the layers, even if the exposure shot sequence is the same as that of the preceding layer, an offset may be caused between layers.

Furthermore, if the exposure sequences is different between layers, e.g., a sequence based on the row zigzag method is used for exposing the preceding layer and a sequence based on the column zigzag method is used for exposing the next layer, the overlay error of a pattern between layers increases.

SUMMARY OF THE INVENTION

The present invention has been made in consideration of the above situation, and has as its first object to provide an exposure method, which can improve overlay accuracy.

It is the second object of the present invention to provide an exposure apparatus, which can improve overlay accuracy.

It is the third object of the present invention to provide a method of manufacturing high-integrated devices with increased productivity.

According to the discoveries made by the present inventor on many years of research, when a plurality of divided areas on a substrate such as a wafer are exposed without any consideration of thermal expansion of the substrate which changes due to the conductance of thermal energy within the substrate or from substrate to holder or within the substrate holder, the position of the divided areas deviate from the designed values when it resumes the cooled state after exposure. The distribution of such deviations on the wafer depends on the exposure sequence or the speed of exposure sequence in the divided areas. In this specification, the thermal expansion of the substrate also includes a state where there is a substrate holding member or the like which measures the thermal expansion of the substrate as a single unit. In such a case, the thermal expansion refers to the general thermal expansion of both the holding member and the substrate.

Therefore, in order to reduce the deviation between the position of the divided areas on the substrate and the designed position of the divided areas in a cooled state after exposure, a correction must be made in the movement amount when the substrate has completed an exposure of a divided area, and moves to expose the next divided area. This correction is made in consideration of the exposure sequence and its proceeding speed in the divided areas. Such corrections are to be made with respect to the deviation distribution on the substrate from the designed position of the divided areas in a cooled state after exposure. The present invention has been made with focus on this point.

According to the first aspect of the present invention, there is provided a first exposure method which sequentially transfers a pattern formed on a mask onto a plurality of divided areas arranged on a substrate along a predetermined direction, in an exposure sequence that proceeds to an adjacent divided area in the predetermined direction, and the exposure method comprises: correcting a movement information so as to make a correction amount of a movement amount of the substrate smaller than a correction amount of a movement amount of the substrate on preceding exposure, and adjusting a positional relationship between the mask and the substrate for exposure of a next divided area; and exposing the next divided area.

In this case, other than correcting the movement amount of the substrate, "correcting a movement information" includes a correction which result is equivalent to correcting the movement amount of the substrate by adjusting the positional relationship between the substrate and the mask. For example, "correcting a movement information" includes correcting a target position when the substrate shifts between divided areas and correcting the movement amount or the movement target position of the mask. In addition, the correction includes correcting of the rotational angle of the mask around a normal to the surface on which the mask pattern is formed, and the correction of the substrate movement can be combined with the correction of the mask movement. Furthermore, "correcting a movement information" includes optically shifting an image of a pattern formed on the mask and electron-optically shifting the image by, for example, adjusting the deflection amount of an electron beam. The correction of an image pattern shift and the correction of the mask or substrate movement can also be combined.

For example, when the exposure sequence is based on the row zigzag method which is a type of exposure sequence used in the first exposure method according to the present invention, thermal energy generated by exposure on each preceding row spreads in the overall substrate as the exposure sequence proceeds from the first, second, third and subsequent rows. Accordingly, the thermal expansion of the substrate gradually increases. However, on considering exposure on a divided area immediately after moving to a new row, the divided area in the new row is temporally close to the divided area that has completed exposure in the preceding row and is thus spatially close. The tendency, in which the divided area that has become subject to exposure on the preceding row temporally close is spatially close to a divided area to be exposed decreases as the exposure in the new row proceeds.

As the exposure sequence in the predetermined direction proceeds, when the movement velocity of an exposure position in the predetermined direction (row direction) is not sufficiently slower than the conductance of thermal energy in the wafer, thermal expansion due to the energy generated by exposure on a divided area is supposed to occur first close to the divided area. Then, the overall substrate is likely to gradually expand due to the generated thermal energy. For this reason, on exposing one row, thermal expansion may gradually decrease as a new divided area becomes subject to exposure along the row direction.

In the first exposure method of the present invention, considering the situation, the movement information is corrected so as to make the correction amount of the movement amount of the substrate in the predetermined direction as the exposure proceeds, smaller than the correction amount of the movement amount of the substrate on preceding exposure thereby adjusting a positional relationship between the mask and the substrate for exposure of a next divided area. This makes it possible to ensure high overlay accuracy.

In the first exposure method according to the present invention, in the case the divided areas are arranged on the substrate in a shape of a matrix, the exposure sequence proceeds to the adjacent divided area in a first row direction of the matrix, and when there is no adjacent divided area in the first row direction then goes on to an adjacent row in a column direction of the matrix, and continues in a second row direction which is opposite to the first row direction, and the correction amount of the movement amount of the substrate can be increased as exposure sequence proceeds to the adjacent row in the column direction. In this case, the first and second row directions are parallel to each other, and opposite in direction.

When exposure is performed in this sequence, many divided areas are exposed after moving in the column direction to change to the current row, and then the sequence proceeds to a new row in the column direction. In this case, the time interval is large between the former and the latter movement of changing rows. Therefore, the influence caused by local thermal expansion in the former movement is similar to the influence caused in the latter movement, however, the overall thermal expansion of the substrate is larger than when the former movement was performed. As the exposure sequence proceeds, therefore, high overlay accuracy can be maintained by increasing the correction amount of the movement of the substrate when a new row of the matrix is subject to exposure.

In the first exposure method according to the present invention, the movement information can be obtained prior exposure on the substrate.

On performing exposure of a multilayer, prior to actually exposing the second or subsequent layer, the movement information can be obtained by detecting positional information of a plurality of predetermined alignment marks which are among a plurality of alignment marks formed on the substrate with the plurality of divided areas; and obtaining positional information of the plurality of divided areas formed on the substrate by statistical calculation based on a result of the detecting. That is, the movement information can be obtained which is corrected based on the alignment measurement results by EGA as described above.

Based on the positional information of a plurality of divided areas, if, for example, a divided area interval is to be obtained as a movement information, the substrate is moved so that the obtained divided area interval is corrected to a new movement amount as a target movement amount in a predetermined direction. When, for example, the coordinate position of each divided area is to be obtained as a movement information, each coordinate position is corrected to a new coordinate position (e.g., a scanning start position in scanning exposure) as a target position, and the substrate is moved.

In addition, the substrate may be moved in accordance with the position information (coordinate position, divided area interval, or the like) of each divided area obtained by the EGA method, and the position of the mask may be corrected by an amount corresponding to a correction amount for the position of each divided area which is obtained as the movement information.

In the alignment method using statistical calculation, including the EGA method, designed positional information (coordinate position, divided area interval, or the like) may be corrected, as well as the calculation result, in consideration of the thermal expansion, and statistical calculation may be performed by using the corrected designed positional information.

In the first exposure method according to the present invention, the correction amount of the movement information can be determined in consideration of thermal expansion of the substrate when the substrate is moving.

In this case, since the temperature of the substrate changes each time the divided area is exposed, and the substrate expands differently, the correction amount of the movement information is determined based on the state of thermal expansion of the substrate when a new divided area is actually subject to exposure. The positional relationship between the substrate and the mask is then adjusted for exposing the next divided area by using the new movement information obtained by correcting the former movement information. This makes it possible to perform exposure so that the divided areas are arranged on the substrate at desired intervals, in a cooled state after the exposure. As a consequence, the overlay accuracy with respect to the next layer can be improved, while performing exposure with high overlay accuracy with respect to the preceding layer.

With a substrate, in practice, the diffusion speed of thermal energy generated by exposure is not very high, and thermal expansion due to thermal energy generated by exposure on a divided area locally occurs near the divided area first. The overall substrate then gradually is affected by thermal expansion. That is, it takes a long time to diffuse heat in the substrate.

Therefore, the correction amount of the movement information can be determined on an assumption that of an exposure already performed on a predetermined layer, a thermal energy generated on an exposure which is performed spatially and temporally close to an exposure to be performed on the divided area causes a local thermal expansion of the substrate, and a thermal energy generated on an exposure which is performed spatially and temporally far away from the exposure to be performed causes thermal expansion of the substrate in general. In such a case, since exposure is performed with careful consideration to the actual thermal expansion of the substrate, the overlay accuracy can be further improved.

In the first exposure method according to the present invention, prior to exposure on the substrate measurement patterns can be sequentially transferred on a plurality of measurement divided areas on a measurement substrate in accordance only with designed intervals between the measurement divided areas before transferring of the measurement substrate; and measurement substrate on which the measurement patterns are transferred can be cooled to a temperature prior to the transfer, and distances can be measured in between the measurement divided areas; and the correction amount of the movement information can be determined based on a result of the measurement.

In this case, prior to exposure for manufacturing devices, the state of thermal expansion of the substrate is measured by test exposure. This test exposure is performed by transferring measurement patterns formed on a measurement mask onto a plurality of measurement divided areas on the measurement substrate on based on only the design measurement divided area interval before the pattern is transferred onto the measurement substrate. In this case, it is preferable that the measurement mask, the measurement pattern, the measurement substrate, the measurement divided areas, the exposure sequence, and the like in test exposure are identical to those in the actual device manufacturing process.

The temperature before transfer may be set to a temperature when the substrate is loaded on the substrate stage on exposure. The measurement substrate may or may not be cooled by using a cooling unit. Alternatively, the measurement substrate may be cooled to the temperature before transfer through a process (PEB, cooling, and the like) identical to that in actual exposure. With the latter case in particular, since the measurement substrate receives the same thermal influence as in actual exposure, thermal expansion of the substrate can be accurately obtained. This makes it possible to ensure high overlay accuracy.

After the measurement substrate having completed test exposure is cooled, the patterns transferred on the measurement substrate are observed, thereby measuring the distances between the measurement divided areas. The measurement result reflects the thermal expansion of the substrate during exposure. The thermal expansion of the substrate due to exposure is then obtained based on the distance measurement result. As a consequence, extremely high overlay accuracy can be ensured. The patterns transferred on the measurement substrate may be latent images, resist patterns, or patterns after etching.

As the divided areas on the substrate are sequentially exposed, thermal expansion of the substrate progresses, as described above. In addition, distortion occurs on the substrate, as well as thermal expansion. Therefore, if a pattern formed on a mask is transferred onto a substrate through the projection optical system without changing the image magnification, the pattern transferred on the respective divided areas on the substrate which is cooled after exposure, may vary in size (e.g., the line width or the like of circuit patterns). In addition, the transferred pattern may be distorted on the substrate that is cooled after the exposure.

Accordingly, in the first exposure method according to the present invention, the image characteristic of a transferred image of the pattern onto the substrate is controlled based on the correction amount of the movement information. In this case, the size of the pattern transferred on the respective divided areas on the substrate that is cooled after the exposure can become identical, and distortion of the transferred patterns can be suppressed. This makes it possible to ensure high overlay accuracy throughout the surface of the divided areas. When a pattern on a mask is transferred onto a substrate through the projection optical system, by controlling the imaging characteristics of the projection optical system the image characteristics of the pattern image transferred onto the substrate can be controlled. The image characteristics of the transferred image of the pattern may be also be controlled by adjusting the positional relationship between the mask and the projection optical system.

In a scanning exposure in which a pattern formed on a mask is transferred onto a substrate while the mask and substrate are synchronously moved, the image magnification in the scanning direction is determined by the moving velocity ratio of the mask and the substrate. If, therefore, a pattern formed on a mask is transferred onto a substrate without changing the moving velocity ratio of the substrate and the mask, the pattern transferred onto the respective divided areas on the substrate that is cooled after the exposure, vary in size.

In addition, as described above, when the proceeding speed of an exposure sequence for divided areas is high, thermal expansion does not uniformly occur in the substrate, and does not occur in the same manner in exposure of respective layers.

Based on this situation, in the first exposure method according to the present invention., in the case the pattern formed on the mask is transferred onto the substrate while synchronously moving the mask and the substrate, at least one of a starting position of the mask which moves synchronously on exposure of the divided area, a starting position of the substrate which moves synchronously, a synchronous velocity ratio between the mask and the substrate, a direction of the mask moving synchronously, a direction of the substrate moving synchronously, and a rotational angle of the mask around a normal to a surface which the patterns are formed, can be corrected with respect to the correction amount of the movement information. With this method, the size of the pattern transferred onto the respective divided areas on the substrate that is cooled after the exposure can be identical in the scanning direction, and distortion of the pattern image transferred onto the substrate can be suppressed. This makes it possible to ensure high overlay accuracy.

In the case of using a projection optical system on scanning exposure, the image magnification of the pattern in the non-scanning direction (i.e., a direction perpendicular to the scanning direction) is corrected by changing imaging characteristics such as the projection magnification of the projection optical system, the distance between the mask and the projection optical system. This makes it possible to make the size of the pattern transferred onto the respective divided areas on the substrate that is cooled after the exposure identical, and suppress the occurrence of distortion of pattern images transferred on the substrate.

According to the second aspect of the present invention, there is provided an exposure method which sequentially transfers a predetermined pattern on a plurality of divided areas arranged on a substrate in a shape of a matrix in a sequence that proceeds to an adjacent divided area in a first row direction of the matrix, and when there is no adjacent divided area in the first row direction then goes on to an adjacent row in a column direction of the matrix, and continues in a second row direction which is opposite to the first row direction, the exposure method which comprises: correcting a movement information so as to make a correction amount of a movement amount of the substrate larger than a correction amount of a movement amount of the substrate on a preceding movement between rows, and adjusting a positional relationship between the mask and the substrate for exposure of a first divided area on a new row; and transferring a pattern onto the first divided area on the new row.

On performing exposure based on the second exposure method according to the present invention, after changing rows by moving in the column direction and exposing many divided areas, it then moves in the column direction to proceeds to a new row subject to exposure. Most of the thermal energy generated by exposure performed between the preceding row changing movement and the new row changing movement, therefore, is sufficiently diffused. As a result, the overall thermal expansion of the substrate in the new row changing movement is larger than that of the substrate in the preceding row changing movement. Accordingly, in the second exposure method according to the present invention, as the exposure sequence proceeds, correction of the latter movement of the substrate proceeding to new rows is made larger than the correction amount of the preceding movement. This makes it possible to maintain high overlay accuracy.

As in the first exposure method according to the present invention, in the second exposure method according to the present invention, the movement information can be obtained prior to exposure on the substrate.

Also, as in the first exposure method according to the present invention, in the second exposure method according to the present invention, the correction amount of the movement information can be determined in consideration of the thermal expansion of the substrate when the substrate is moving.

With this exposure method, the correction amount of the movement information can also be determined based on thermal energy generated by an exposure already performed on a predetermined layer on the substrate. In this case, the correction amount of the movement information can be determined by a function using a number of divided areas in which exposure is already performed on the predetermined layer as a variable. In addition, similar to the first exposure method according to the present invention, the correction amount of the movement information can also be determined on an assumption that of an exposure already performed on the predetermined layer, a thermal energy generated on an exposure which is performed spatially and temporally close to an exposure to be performed on the divided area causes a local thermal expansion of the substrate, and a thermal energy generated on an exposure which is performed spatially and temporally far away from the exposure to be performed causes thermal expansion of the substrate in general.

As in the first exposure method according to the present invention, in the second exposure method according to the present invention, prior to exposure on the substrate, the method can further comprise: transferring sequentially measurement patterns on a plurality of measurement divided areas on a measurement substrate in accordance only with designed intervals between the measurement divided areas before transferring of the measurement substrate; cooling the measurement substrate on which the measurement patterns are transferred to a temperature prior to the transfer, and measuring distances in between the measurement divided areas; and determining the correction amount of the movement information based on a result of the measurement.

Like the first exposure method according to the present invention, in the second exposure method according to the present invention, in order to reduce the difference between the size of pattern transferred onto the respective divided areas or suppress distortion of the transferred patterns on the substrate that is cooled after exposure, an image characteristic of a transferred image of the pattern onto the substrate can be controlled based on the correction amount of the movement information.

According to the third aspect of the present invention, there is provided a third scanning exposure method which sequentially transfers a pattern formed on a mask onto a plurality of divided areas arranged on a substrate while synchronously moving the mask and the substrate, the exposure method comprising: controlling a condition for scanning exposure on a predetermined layer in accordance with thermal energy generated by an exposure already performed on the predetermined layer on the substrate.

In a scanning exposure method like the third exposure method according to the present invention, an image magnification in the scanning direction is determined by the moving velocity ratio of a substrate and a mask. Therefore, when a pattern formed on a mask is transferred onto a substrate without changing the moving velocity ratio of the substrate and the mask, the pattern transferred onto the respective divided areas on the substrate that is cooled after the exposure, vary in size.

Also, distortion due to thermal expansion does not uniformly occur in a substrate, and does not occur identically in the respective layers.

Furthermore, the arrangement of the divided areas on the substrate that is cooled after the exposure deviates from a desired layout due to the thermal expansion of the substrate during the exposure.

In the exposure method according to the present invention, therefore, a condition for scanning exposure is controlled in accordance with the thermal energy generated by exposure that has already been performed on a predetermined layer on a substrate. The condition for scanning exposure, is at least one of a starting position of the mask which moves synchronously on exposure of the divided area, a starting position the substrate which moves synchronously, a synchronous velocity ratio between the mask and the substrate, a direction of the mask moving synchronously, a direction of the substrate moving synchronously, and a rotational angle of the mask around a normal to a surface which the patterns are formed, is corrected with respect to the correction amount of the movement information.

According to this method, the size of the pattern transferred onto the respective divided areas on the substrate that is cooled after the exposure can be identical in the scanning direction. In addition, distortion of pattern images transferred on the substrate can be suppressed. Furthermore, the deviation of the divided area arrangement on the substrate that is cooled after the exposure from the desired layout can be suppressed. Therefore, high overlay accuracy can be ensured.

According to the fourth aspect of the present invention there is provided a fourth exposure method which sequentially transfers a pattern formed on a mask onto a plurality of divided areas arranged on a substrate, the method comprising: making a correction of a movement of the substrate on exposure of a predetermined layer on an assumption that of an exposure already performed on the predetermined layer, a thermal energy generated on an exposure which is performed spatially and temporally close to an exposure performed on the divided area causes a local thermal expansion of the substrate, and a thermal energy generated on an exposure which is performed spatially and temporally far away from the exposure to be performed causes thermal expansion of the substrate in general.

According to this method, in the case it is appropriate to employ the model that thermal expansion due to the thermal energy generated by exposure on a divided area occurs, it first locally occurs in a portion near the divided area and then gradually conducts to the overall substrate. Performing exposure accurately considering the actual thermal expansion of the substrate, thus becomes possible, further improving the overlay accuracy.

According to the fifth aspect of the present invention, there is provided a first exposure apparatus which sequentially transfer a pattern formed on a mask onto a plurality of divided areas arranged on a substrate along a predetermined direction, in an exposure sequence that proceeds to an adjacent divided area in the predetermined direction, the exposure apparatus comprising: a substrate stage which holds the substrate; and a movement control unit which corrects a movement information so as to make a correction amount of a movement amount of the substrate smaller than a correction amount of a movement amount of the substrate on preceding exposure, and adjusting a positional relationship between the mask and the substrate for exposure of a next divided area.

According to this apparatus, the movement control unit corrects the movement information so as to make the correction amount of the movement amount of the substrate smaller than that of the substrate for the preceding exposure. After the positional relationship between the mask and the substrate is adjusted for exposure on the next divided area, exposure is performed. That is, the pattern on the mask can be transferred onto the substrate by exposing the respective divided areas by using the first exposure method of the present invention. This makes it possible to ensure high overlay accuracy.

In the first exposure apparatus according to the present invention, the divided areas can be arranged on the substrate in a shape of a matrix, and the exposure sequence proceeds to the adjacent divided area in a first row direction of the matrix, and when there is no adjacent divided area in the first row direction then goes on to an adjacent row in a column direction of the matrix, and continues in a second row direction, which is opposite to the first row direction, and the movement control unit increases the correction amount of the movement amount of the substrate as exposure sequence proceeds to the adjacent row in the column direction.

This apparatus can further comprise a measuring unit which measures the movement information prior to exposure of the substrate. In this case, the measuring unit comprises: a position detection unit which detects positional information of a plurality of predetermined alignment marks which are among a plurality of alignment marks formed on the substrate with the plurality of divided areas; and a calculation unit which calculates positional information of the plurality of divided areas formed on the substrate by statistical calculation based on a result of the detecting.

In such a case, on multilayer exposure, before actually exposing the second or subsequent layer, the position detection unit detects the positional information of a plurality of predetermined alignment marks which are among a plurality of alignment marks formed on the substrate with a plurality of divided areas. The calculation unit obtains the positional information of a plurality of divided areas formed on the substrate by statistical calculation such as least-squares approximation based on the results of the detection.

Subsequently, the respective divided areas are sequentially exposed. When a new divided area is subject to exposure, the movement control unit corrects the movement information obtained based on the positional information in consideration of the thermal expansion of the substrate. The positional relationship between the substrate and the mask is adjusted according to the corrected updated. movement information.

Multilayer exposure can therefore be performed while maintaining high overlay accuracy, regardless of the exposure sequence for each layer.

The first exposure apparatus according to the present invention can further comprise a configuration of an image characteristic control system which controls an image characteristic of a transferred image of the pattern onto the substrate based on the correction amount of the movement information. In such a case, the image characteristic control system controls imaging characteristics such as the image magnification and image distortion of the pattern on the substrate in accordance with the thermal expansion of the substrate. This makes it possible to reduce the difference between the size of the pattern transferred onto the respective divided areas on the substrate that is cooled after the exposure and suppress distortion.

The structure of the image characteristic control system may vary. For example, the image characteristic control system can comprise: a synchronous moving mechanism which synchronously moves the mask and the substrate on exposure of the divided areas; and a synchronous movement control mechanism which controls at least one of a starting position of the mask which moves synchronously on exposure of the divided area, a starting position of the substrate which moves synchronously, a synchronous velocity ratio between the mask and the substrate, a direction of the mask moving synchronously, a direction of the substrate moving synchronously, and a rotational angle of the mask around a normal to a surface which the patterns are formed, is corrected with respect to the correction amount of the movement information.

In this case, on exposing each divided area by scanning exposure, the difference between the size of the pattern transferred on the respective divided areas on the substrate that is cooled after the exposure can be reduced, and distortion of the transferred patterns can be suppressed. This makes it possible to ensure high overlay accuracy.

In an exposure apparatus using a projection optical system for scanning exposure, it is preferable to control the image magnification of the pattern and imaging characteristics in the non-scanning direction such as by changing the projection magnification of the projection optical system, the distance between the mask and the projection optical system.

According to the sixth aspect of the present invention, there is provided a second exposure apparatus which sequentially transfers a pattern formed on a mask onto a plurality of divided areas arranged on a substrate in a shape of a matrix in a sequence that proceeds to an adjacent divided area in a first row direction of the matrix, and when there is no adjacent divided area in the first row direction then goes on to an adjacent row in a column direction of the matrix, and continues in a second row direction, the second-row direction which is opposite to the first row direction, the exposure apparatus comprising: a substrate stage which holds the substrate; and a movement control unit which corrects a movement information so as to make a correction amount of a movement amount of the substrate larger than a correction amount of a movement amount of the substrate on a preceding movement between rows, and adjusting a positional relationship between the mask and the substrate for exposure of a first divided area on a new row.

According to this apparatus, the movement control unit corrects the movement information to make the correction amount of the substrate larger than the correction amount of the substrate for the preceding exposure. After the positional relationship between the mask and the substrate is adjusted for exposure on the first divided area on the next row, exposure is performed. That is, the pattern on the mask can be transferred onto the substrate by using the second exposure method of the present invention and exposing the respective divided areas. This makes it possible to ensure high overlay accuracy.

By using the exposure method of the present invention in a lithographic process and performing exposure, fine patterns can be formed on a plurality of layers on a substrate with high overlay accuracy. This makes it possible to manufacture high-integration microdevices with a high yield, thus improving the productivity. Therefore, according to another aspect of the present invention, there is provided a device manufacturing method using the exposure method of the present invention.

BRIEF DESCRIPTION OF THE DRAWINGS

FIG. 2 is a perspective view for explaining the principle of scanning exposure performed by the apparatus in FIG. 1;

DESCRIPTION OF THE PREFERRED EMBODIMENTS

First Embodiment

An exposure method and apparatus according to the first embodiment of the present invention will be described below with reference to FIGS. 1 to 4.

Figure 1:
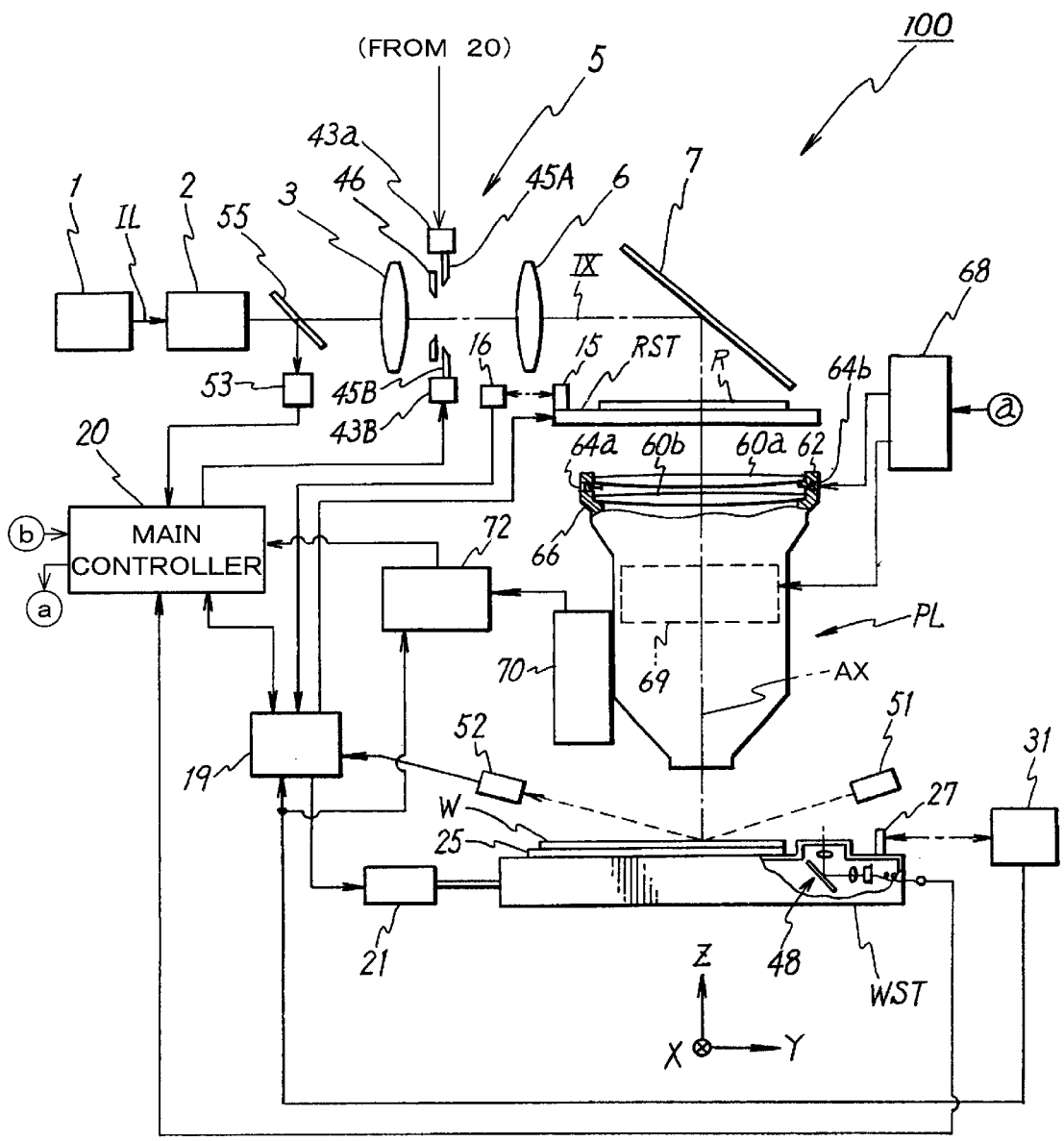
FIG. 1 is a view showing the schematic arrangement of an exposure apparatus according to the first embodiment.

FIG. 1 shows the schematic arrangement of an exposure apparatus 100 according to the first embodiment. The exposure apparatus 100 is a scanning type projection exposure apparatus based on a so-called step-and-scan exposure method.

The exposure apparatus 100 comprises: a light source 1 and an illumination system including an illumination optical system (2, 3, 5–7); a reticle stage RST serving as a mask stage for holding a reticle R as a mask; a projection optical system PL; a wafer stage WST for moving two-dimensionally a wafer W as a substrate within an X-Y plane; a position detecting system (70, 72) for detecting the position of the wafer W; and a control system for controlling these components.

The illumination system includes: the light source 1; an illuminance unifying optical system 2 structured of a collimator lens, fly-eye lens, and the like (none of which are shown in Figs.); a relay lens 3; a reticle blind 5; a relay lens 6; and a deflecting mirror 7 (of these components, the illumination optical system is structured of the illuminance unifying optical system 2, relay lenses 3 and 6, and the deflecting mirror 7).

The respective components of this illumination system will be described below, together with their operation. Illumination light IL is emitted from the light source 1 as an exposure light, passes through a shutter (not shown in Figs.) and then is converted into a light beam which has an almost uniform illuminance distribution by the illuminance unifying optical system 2. As the illumination light IL, for example, an excimer laser beam such as a KrF excimer laser beam or an Arf excimer laser beam, an $F_2$ laser (wavelength=157 nm), a copper vapor laser or a YAG laser harmonics, an emission line (e.g., g-line or i-line) in the ultraviolet region.

The light beam, which is emitted parallel from the illuminance unifying optical system 2, reaches the reticle blind 5 through the relay lens 3. This reticle blind 5 is configured of a movable blind having two movable blades 45A and 45B (this movable blind will be referred to as "movable blind 45A and 45B", as appropriate). Also, a fixed blind 46, which has a fixed opening shape, is arranged near the movable blind 45A and 45B. The arrangement surface of the movable blind 45A and 45B is conjugate to the pattern surface of the reticle R. The fixed blind 46 is a field stop which is a rectangular shaped opening formed by, for example, four knife edges, and the width of the rectangular opening in the vertical direction is determined by the movable blind 45A and 45B. By using the fixed blind 46 and movable blind 45A and 45B, the width in the scanning direction of the reticle R in a slit-shaped illumination area IAR (see FIG. 2) through which the reticle R is illuminated, can be set to a preferred value. The movable blind 45A and 45B are driven in the opening/closing direction by a movable blind driving mechanism 43A and 43B. The driving mechanism 43A and 43B are both controlled by a main controller 20 in accordance with masking information in a file called a process program stored in a memory (not shown in FIGS.).

In between the illuminance unifying optical system 2 and the relay lens 3, a half mirror 55 is arranged. Of the light beam emerging parallel from the illuminance unifying optical system 2, the light beam reflected by the half mirror 55 is incident on a light amount sensor 53 for monitoring the amount of illumination light IL. The light amount information of the illumination light IL detected by the light amount sensor 53 is sent to the main controller 20.

The light beam, which passes through the reticle blind 5, then passes through the relay lens 6 and reaches the deflecting mirror 7. The deflecting mirror 7 bends the optical path of the light beam vertically downward. The light beam which is vertically bent downward, then illuminates the illumination area IAR portion (see FIG. 2) of the reticle R, on which a circuit pattern or the like is drawn.

The reticle R is fixed on the reticle stage RST, for example, by vacuum chucking. In order to position the reticle R, the reticle stage RST is structured so that it can be finely driven two-dimensionally (in the X-axis direction, the Y-axis direction perpendicular to the X-axis direction, and the rotational direction around the Z-axis perpendicular to the X-Y plane) within a plane perpendicular to an optical axis IX (coinciding with an optical axis AX of the projection optical system PL, which will be described later) of the illumination optical system.

The reticle stage RST can be moved on a reticle base (not shown in FIGS.) in a predetermined scanning direction (Y-axis direction in this case) at a designated scanning velocity by a reticle driving portion (not shown in FIGS.) structured of a linear motor or the like. It has a movement stroke which the entire surface of the reticle R can at least cross the optical axis IX of the illumination optical system.

On the reticle stage RST, a movable mirror 15 for reflecting a laser beam from a reticle laser interferometer (to be referred to as a "reticle interferometer" hereinafter) 16 is fixed. The reticle interferometer 16 detects the position and rotation amount (including at least a yawing amount) of the reticle stage RST within the stage movement plane at all times by, for example, a resolution of about 0.5 to 1 nm.

In practice, a movable mirror which has a reflecting surface perpendicular to the scanning direction (Y-axis direction) and a movable mirror which has a reflecting surface perpendicular to the non-scanning direction (X-axis direction) are mounted on the reticle stage RST. Also, the reticle interferometer 16 is arranged on one axis in the scanning direction, and on two axes in the non-scanning direction. However, in FIG. 1, these are represented as the movable mirror 15 and reticle interferometer 16.

Positional information of the reticle stage RST is sent from the reticle interferometer 16 to a stage control system 19 and to the main controller 20 via the stage control system 19. The stage control system 19 drives the reticle stage RST through a reticle driving portion (not shown in Figs.) by instructions from the main controller 20 based on the positional information of the reticle stage RST.

A reticle alignment system (not shown in FIGS.) determines the initial position of the reticle stage RST so that the reticle R is accurately positioned at a predetermined reference position. Therefore, the position of the reticle R can be measured with a sufficiently high precision by only measuring the position of the movable mirror 15 with the reticle interferometer 16.

The projection optical system PL is arranged below the reticle stage RST in FIG. 1. And the direction of the optical axis AX (which coincides with the optical axis IX of the illumination optical system) of the projection optical system PL is the Z-axis direction. In order to make the projection optical system PL double telecentric, a refraction optical system configured of a plurality of lens elements arranged at predetermined intervals along the optical axis AX is employed. The projection optical system PL is a reduction optical system having a predetermined projection magnification of for example, ⅕ (¼ or ⅙). So, when the illumination area IAR of the reticle R is illuminated with the illumination light IL from the illumination optical system, a reduced image (partial inverted image) of the circuit pattern of the reticle R in the illumination area IAR is formed on the wafer W which surface is coated with a photoresist.

The projection optical system PL is structured of a plurality of lens elements 60a, 60b, . . . which have a common axis so as to be a double telecentric optical arrangement. of the lens elements, the topmost lens element 60a located nearest to the reticle stage RST is held by a ring-shaped supporting member 62. The supporting member 62 is held at three points by extendable driving elements, e.g., piezoelectric elements 64a, 64b, and 64c (the driving element 64c on the depth side of the drawing is not shown), and is connected to a lens barrel portion 66. And by the extendable driving elements 64a, 64b and 64c, three points of the peripheral portion of the lens element 60a can be independently moved in the optical axis AX direction of the projection optical system PL. That is, the lens element 60a can be moved parallel along the optical axis AX in accordance with the displacement amount of the respective driving elements 64a, 64b, and 64c, and can also be tilted at a desired angle with respect to a plane perpendicular to the optical axis AX. An image forming characteristics correction controller 68 controls the voltage applied to these driving elements 64a, 64b, and 64c based on instructions from the main controller 20. By this control, the displacement amount of the driving elements 64a, 64b, and 64c is controlled. In FIG. 1, the optical axis AX of the projection optical system PL coincides with the optical axis of the lens element 60b and other lens elements (not shown in FIGS.) fixed to the lens barrel portion 66.

In this embodiment, a sealed chamber 69 is formed between specific lens elements around the center of the projection optical system PL in the optical axis direction. The internal pressure of the sealed chamber 69 is adjusted by a pressure adjustment mechanism (e.g., bellows pump and the like) (not shown in FIGS.). The pressure adjustment mechanism is also controlled by the image forming characteristics correction controller 68 based on the instructions from the main controller 20. By the control, the internal pressure of the sealed chamber 69 is adjusted.

The magnification of the projection optical system PL, distortion, and the imaging plane of the projection optical system PL can be changed by moving and tilting the lens element 60a in the optical axis AX direction. In addition, by changing the internal pressure of the sealed chamber 69 the magnification and imaging plane of the projection optical system PL can be changed. In this embodiment, an image forming characteristics control mechanism to mainly control magnification, distortion, and the image forming plane of a pattern image formed on the reticle R is configured of: the driving elements 64a, 64b, and 64c; the sealed chamber 69, and the displacement amount of the driving elements; the image forming characteristics correction controller 68 which controls the internal pressure of the sealed chamber 69.

A wafer holder 25 is mounted on the wafer stage WST. The wafer W as a substrate is held on the wafer holder 25 by vacuum chucking. The wafer stage WST moves the mounted wafer W in the X, Y, and Z directions.

On the wafer stage WST, a movable mirror 27 is fixed for reflecting a laser beam from a wafer laser interferometer (to be referred to as a "wafer interferometer" hereinafter) 31. The wafer interferometer 31 arranged externally detects the position of the wafer W in the X-Y plane at all times with a resolution of about 0.5 to 1 nm.

In practice, a movable mirror which has a reflecting surface perpendicular to the Y-axis direction, that is the scanning direction, and a movable mirror which has a reflecting surface perpendicular to the X-axis direction, that is the non-scanning direction, are mounted on the wafer stage WST. The wafer interferometer 31 is arranged on one axis in the scanning direction, and on two axes in the non-scanning direction. However, in FIG. 1, these are represented as the movable mirror 27 and wafer interferometer 31. The wafer interferometer 31 may be respectively added to one axis in the scanning direction and to one axis in the non-scanning direction so as to measure the pitching amount and rolling amount in addition to positions in the X and Y directions and the yawing amount.

The positional information (or velocity information) is sent to the stage control system 19 and to the main controller 20 through the stage control system 19. The main controller 20 instructs the stage control system 19 to control and drive the wafer stage WST within the X-Y plane via a wafer driving unit 21 (the unit includes all driving systems in the respective directions, i.e., the X, Y, and Z directions) based on the positional information (or velocity information). A projection magnification control system is structured of: the stage control system 19; the reticle driving system; the projection optical system PL; the image forming characteristics correction controller 68; and the wafer driving unit 21.

The wafer stage WST has a light amount sensor 48 incorporated, for detecting the amount of exposure illumination light through the projection optical system PL. When the light amount sensor 48 is to detect a light amount, the main controller 20 controls the position of the wafer stage WST by using the stage control system 19 and wafer driving unit 21, and moves the light amount sensor 48 below the projection optical system PL. The light amount sensor 48 informs the main controller 20 of the light amount information detected at this position.

The apparatus in FIG. 1 further includes a multiple focal position detection system for detecting the positions of within the exposure area IA on the surface of the wafer W and the area around it in the Z direction (the direction of the optical axis AX). The multiple focal position detection system is one of a focus detection system based on the oblique incident light method. The multiple focal position detection system, as is shown in FIG. 1, is configured of an irradiating optical system 51 and a light-receiving optical system 52. For example, the irradiating optical system 51 includes an optical fiber bundle, condenser lens, pattern forming plate, lens, irradiating object lens, and the like (none of which are shown). The light-receiving optical system 52 includes a condenser object lens, a rotational direction vibration plate, an image forming lens, a light-receiving slit plate, a light-receiving unit having many photosensors, and the like (none of which are shown in Figs.). The detailed structure of this multiple focal position detection system is disclosed in, for example, U.S. Pat. No. 5,448,332. The disclosure described above is fully incorporated by reference herein.

The operation of the multiple focal position detection system (51, 52) will be briefly described. With the irradiating optical system 51, an illumination light source (not shown in Figs.) emits an illumination light for focus position detection, which is incident via the optical fiber bundle and illuminates the pattern forming plate through the condenser lens. The illumination light for focus position detection is different from the exposure light described earlier, and has a wavelength that does not expose the photoresist on the wafer W.

On the pattern forming plate, a plurality of slit-shaped opening patterns is formed in the shape of a matrix. The illumination light (an image light beam of an opening pattern) which passes through each slit-shaped opening pattern on the pattern forming plate is projected on the exposure surface of the wafer W through the irradiating object lens. As a consequence, the image of the slit-shaped opening pattern on the pattern forming plate is projected and formed on the exposure surface of the wafer W. A part of the opening pattern is imaged in the exposure area IA (see FIG. 2) on the wafer W, and the remaining pattern is imaged outside the exposure area IA on the wafer W.

Then, the reflected light beam from the exposure surface of the wafer W proceeds in a direction tilted at a predetermined angle in respect to the optical axis AX, symmetrical to the image light beam from the irradiating optical system 51. The light beam is then re-imaged on the light-receiving slit plate arranged in front of the light-receiving unit through the condenser object lens, the rotational direction vibration plate, and the image forming lens. The light-receiving unit detects the image, and the composite signal obtained by the selected light-receiving unit is synchronously detected. The multiple focus signals obtained by the synchronous detection are sent to the main controller 20. The main controller 20 then uses the focus signals related to the opening patterns imaged outside the exposure area IA of the wafer W in the scanning direction, to predict the next focus state. That is, predict whether the surface of the wafer w changes in the +Z direction or −Z direction. Based on the prediction and the focus signals related to the opening patterns imaged in the exposure area IA of the wafer W, focus and leveling adjustment on the exposure area IA of the wafer W are performed.

The position detecting system described above includes an off-axis alignment microscope 70 and an image processing unit 72. The alignment microscope 70 is arranged on a side surface of the projection optical system PL, and observes a position detection mark (alignment mark) formed on the wafer W. The image processing unit 72 receives the results of the observation obtained by the alignment microscope 70 and the positional information of the wafer W from the wafer interferometer 31, and calculates the position of the position detection mark on the wafer W. The position of the position detection mark obtained by the image processing unit 72 is then sent to the main controller 20.

With the scanning exposure apparatus 100 of this embodiment, as shown in FIG. 2, the reticle R is illuminated with the rectangular (slit-shaped) illumination area IAR which longitudinal direction coincides with a direction perpendicular to the scanning direction (Y-axis direction) of the reticle R. The illumination area IAR (which center almost matches with the optical axis AX) is projected on the wafer W through the projection optical system PL. As a consequence, a slit-shaped projection area conjugate to the illumination area IAR, i.e., the exposure area IA, is formed. On exposure, the reticle R moves in the −Y direction at a velocity $V_R$. Since the wafer W and reticle R have an inverted image forming relationship, the wafer W moves in a direction (+Y direction) opposite to the direction of the velocity $V_R$ at a velocity $V_W$ in synchronism with the reticle R. Thus, the entire surface of a shot area SA on the wafer W is exposed.

The moving velocity ratio $V_W/V_R$ of the wafer W and the reticle R, accurately corresponds to the reduction magnification of the projection optical system PL. The pattern on a pattern area PA of the reticle R is accurately reduced and transferred onto the shot area SA on the wafer W.

The width of the illumination area IAR in the longitudinal direction is determined by the fixed blind 46 to be larger than the pattern area PA on the reticle R and smaller than the maximum width of a light-blocking area ST. Therefore, by moving the reticle R, the entire area the pattern area PA is illuminated.

With the exposure apparatus 100, on scanning exposure, the main controller 20 performs positioning (alignment) of the reticle R and wafer W via the stage control system 19, wafer driving unit 21, and the like based the results obtained by the position detecting system (70, 72). In addition, the main controller 20 controls the driving of the Z-axis direction and the tilting direction of the wafer W via the stage control system 19, wafer driving unit 21, and the like based on the detection signal obtained by the multiple focal position detection system (51, 52). By this control, the imaging plane of the projection optical system PL coincides with the surface of the wafer W (the wafer surface falls within the depth of focus of the best imaging plane of the projection optical system PL).

Figure 3:
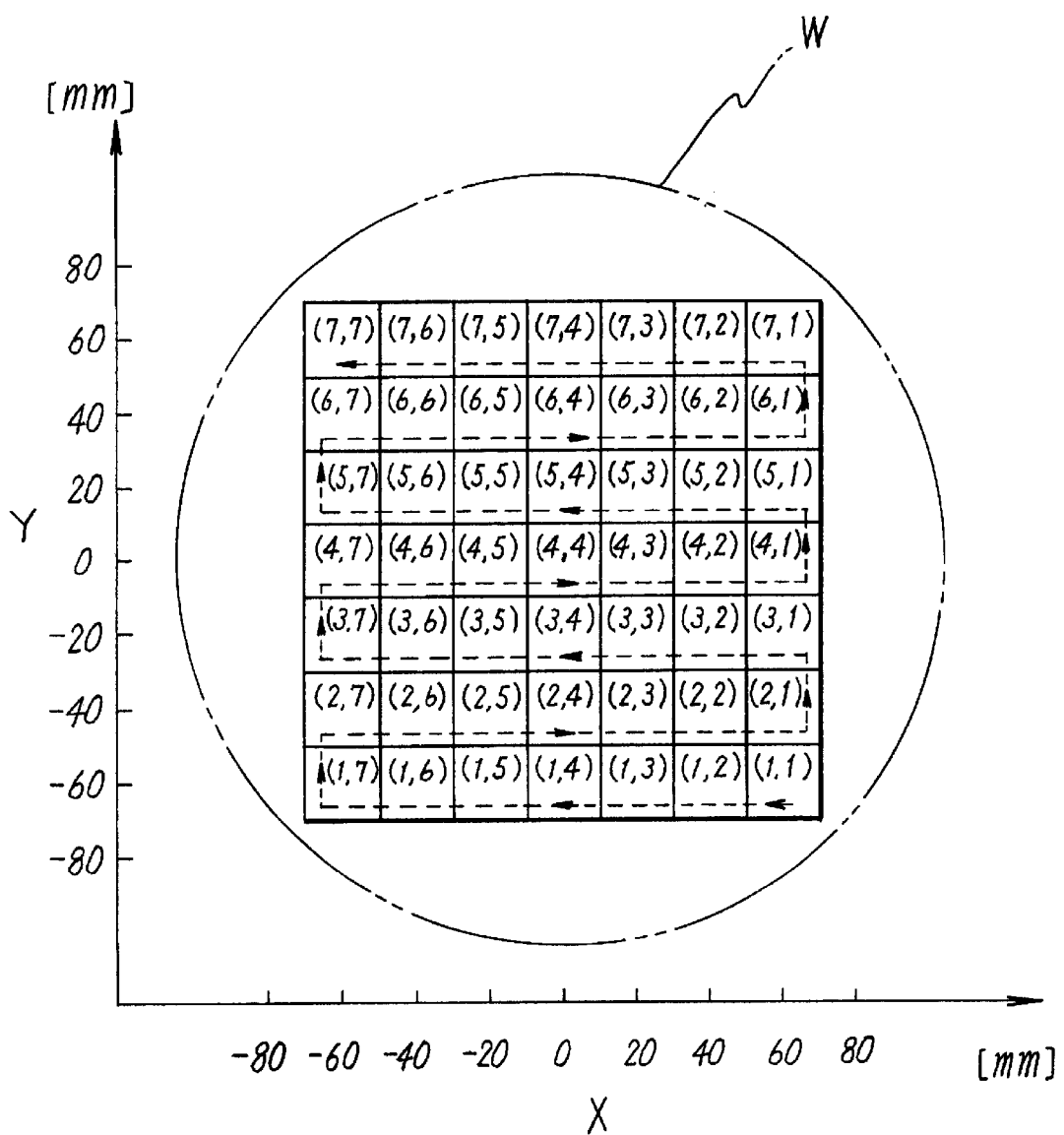
FIG. 3 is a view for explaining the arrangement of shot areas and exposure sequence in the first embodiment.

FIG. 3 shows the layout design of shot areas as divided areas on the wafer W and the exposure sequence in this embodiment. As shown in FIG. 3, on the wafer W, 49 shot areas are arranged in the form of a 7×7 matrix. The position of a shot area is hereinafter defined by a row number i (i=1 to 7) and column number j (j=1 to 7) will be expressed by SA(i, j). In FIG. 3, lead lines are omitted, and only (i, j) is written of each shot area SA(i, j). As shown in FIG. 3, the horizontal direction (X-axis direction) of the drawing coincides with the row direction, the lowermost row is the first row, and the uppermost row is the seventh row. The vertical direction of the drawing of FIG. 3 (Y-axis direction) coincides with the column direction, the rightmost column is the first column, and the leftmost column is the seventh column.

Each shot area has a square shape, and the intervals between the shot areas in the row and column directions are both designed to be 20 mm.

Supposing that the central point of the wafer W is expressed as $(0, 0)$ as in the X-Y coordinates. In this case, the designed central position (exposure design position) $(X_i, Y_j)$ of the shot area $SA(i, j)$ is thus expressed:

$$(X_i, Y_j) = ((4-i) \cdot \Delta x_0, (j-4) \cdot \Delta y_0) \qquad (1)$$

$\Delta x_0$ is the intervals (=20 mm) between the shot areas in the design row direction, and $\Delta y_0$ is the intervals (=20 mm) between the shot areas in the design column direction.

For example, the designed central position coordinates of a shot area ($SA(1, 1)$) are (60 mm, −60 mm), and the designed central position coordinates of a shot area $SA(1, 2)$ on the left side of the shot area $SA(1, 1)$ are (40 mm, −60 mm).

In FIG. 3, the dotted arrow shows the exposure sequence of the shot areas. That is, in this embodiment, the shot area $SA(1, 1)$ is the first subject to exposure, and sequentially as in shot area $SA(1, 2)$, shot area $SA(1, 3)$, in the row direction where the order of column number ascends, the shot area subject to exposure is renewed. When exposure of the shot area $SA(1, 7)$ is completed, the next shot area subject to exposure is shot area $SA(2, 7)$. Then the shot area subject to exposure is renewed sequentially as in shot areas $SA(2, 6)$ and shot area $SA(2, 5)$, in the row direction with the column number descending in order. Subsequently, as described above, the shot area subject to exposure is sequentially renewed in a zigzag pattern, and finally, the shot area $SA(7, 7)$ is exposed.

The expansion mechanism of the wafer W and wafer holder 25 due to thermal energy by exposure irradiation in this embodiment will be described. This embodiment uses a model in which the thermal energy generated upon exposure is immediately conducted to the wafer W and wafer holder 25. That is, a model in which the thermal energy generated upon exposure on a given shot area is widely diffused into the wafer W and wafer holder 25 before exposure on the next shot area. As a premise, the wafer W and wafer holder 25 are to be firmly fixed together by vacuum chucking. The thickness of the wafer W is, in general, 1 mm or less, and the thickness of the wafer holder 25 is about 10 mm. Therefore, expansion of the wafer W is suppressed by the wafer holder 25, but when the wafer holder 25 expands, the wafer W almost follows the wafer holder 25.

Figure 4:
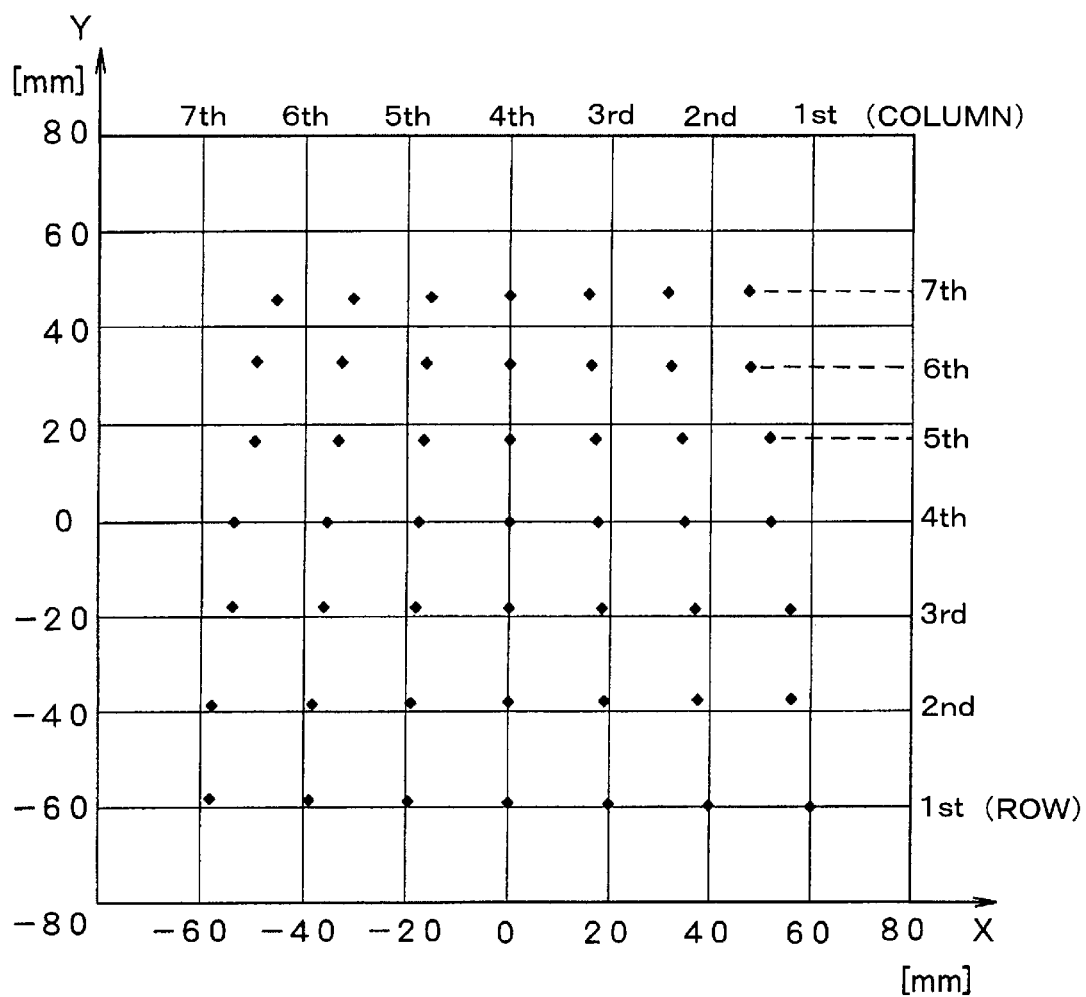
FIG. 4 is a graph for explaining shot area arrangement deviations in a thermal expansion model in the first embodiment.

When the thermal energy generated in the wafer W by exposure on one shot area is expressed as E[J], the total thermal capacity of the wafer holder 25 and wafer W as C[J/K], and the linear expansion coefficient as $\alpha$[1/K], the thermal expansion of the wafer W upon exposure on the first shot area $SA(1, 1)$ can be expressed as $(\alpha \cdot E/C)$ After exposure on the second shot area $SA(1, 2)$, the wafer W and wafer holder 25 may expand by $(2\alpha \cdot E/C)$. After exposure on the 48th shot area $SA(7, 6)$, the wafer W and wafer holder 25 may expand by $(48\alpha \cdot E/C)$ Accordingly, when each shot area is exposed with the stepping amount in the row direction being 20 mm and the stepping amount in the column direction being 20 mm, the position of each shot area deviates inwardly from the designed position when the temperature of the wafer W returns to the temperature prior to exposure. FIG. 4 shows the deviation of the shot areas in such a case. In FIG. 4, the central point of each shot area is represented by the symbol "♦", and the illustration of the shape of each shot area is omitted.

The exposure method using the exposure apparatus 100 will be described below.

To obtain the values of thermal expansion such as the wafer W, the thermal energy E generated in the wafer W upon exposure on one shot area, a total thermal capacity C of the wafer holder 25 and the wafer W, and a linear expansion coefficient $\alpha$ must be obtained. Of these values, the thermal capacity C and linear expansion coefficient $\alpha$ are determined by the materials used for the wafer W and wafer holder 25, and hence are to be obtained prior to exposure on the wafer W.

The thermal energy E is determined by the energy of exposure light that reaches the wafer W, the reflectance of the surface of the wafer W, and the reaction characteristics and thickness of the resist coated on the wafer W. These values also vary depending on the types of devices to be manufactured. Even on exposure for manufacturing the same device, if a multilayer exposure is performed, the values vary depending on the layer. Accordingly, it is necessary to obtain the values for each layer.

The data on the reaction characteristics and thickness of a resist to be coated on the wafer W is input by the operator of the apparatus in accordance with the layer to be exposed, and the data is sent to the main controller 20. The reflectance on the surface of the wafer W is measured for each resist coated on the wafer W, and the corresponding data is input by the operator in accordance with the layer to be exposed, and is sent to the main controller 20.

If the energy of exposure light that reaches the wafer W is obtained in advance, it is also input by the operator in accordance with the layer to be exposed, and the data sent to the main controller 20. In the case the energy of exposure light that reaches to the wafer W is not yet obtained, the energy is measured prior to exposure on the layer. On measuring the energy of exposure light that reaches the wafer W, for example, exposure illumination light is emitted from the light source 1 after the light amount sensor 48 is moved below the projection optical system PL while the reticle R is mounted on the reticle stage RST. Then, the energy of exposure light that reaches the wafer W is measured by detecting the amount of light that has reached the light amount sensor 48. In this embodiment, the energy of exposure light that reaches the wafer W is measured prior to exposure on each layer.

First of all, in this embodiment, the first layer is exposed. On exposing the first layer, the reticle R on which a pattern for the first layer is formed is loaded onto the reticle stage RST by a reticle loader (not shown in FIGS.). The light amount sensor 48 is then moved below the projection optical system PL. The light amount sensor 48 is moved via the stage control system 19 and wafer driving unit 21 by the main controller 20.

Next, illumination light is emitted from the light source 1, and the amount of exposure light that has reached the wafer stage WST is measured by the light amount sensor 48. The light amount sensor 48 informs the main controller 20 of the measurement result. Then, based on the results, the main controller 20 obtains the thermal energy E generated in the wafer W when exposing one shot area. Furthermore, the main controller 20 obtains the thermal expansion $(\alpha \cdot E/C)$ of the wafer W when exposing one shot area of the first layer, by using the total thermal capacity C of the wafer W and wafer holder 25 and the linear expansion coefficient $\alpha$.

Then, the wafer W to be exposed is loaded on the wafer stage WST by a wafer loader (not shown in FIGS.). The main controller 20 controls the wafer stage WST through the stage control system 19 and the wafer driving unit 21 based on the positional information (or velocity information) from the wafer interferometer 31, thereby moving the wafer W so that the shot area SA(1, 1) is located at the exposure position below the projection optical system PL. That is, since the central point of the first shot area is defined (60 mm, −60 mm) in the wafer coordinate system as above, the wafer stage WST is moved from the central position so that the wafer W is set to the scanning starting position. Simultaneously, the reticle stage RST is moved to so as to set the X-Y position of the reticle R to the scanning starting position. The main controller 20 moves these stages through the stage control system 19, the reticle driving portion (not shown in FIGS.).

The stage control system 19 then relatively moves the reticle R and the wafer W at a velocity ratio corresponding to the projection magnification of the projection optical system PL via the reticle driving portion (not shown in Figs.) and wafer driving unit 21. This is based on the X-Y positional information of the reticle R measured by the reticle interferometer 16, and the X-Y positional information of the wafer W, measured by the wafer interferometer 31. With these relative movements, scanning exposure is performed.

Also, the stage control system 19 adjusts the plane position by driving/controlling a substrate table 18 in the Z-axis direction and tilting direction via the wafer driving unit 21. The adjustment is performed based on the Z position information and tilt information of the wafer which are detected by the multiple focal position detection system (51, 52).

When the transfer of a reticle pattern onto the shot area SA(1, 1) is completed by the scanning exposure controlled as described above, the wafer W is stepped, by one shot area.

The exposure design position of the central point of the shot area SA(1, 2) which is subject to the second exposure is (40 mm, −60 mm), as described earlier. The wafer W and wafer holder 25, however, have expanded by ($\alpha \cdot E/C$) due to exposure on the first shot area SA(1, 1). Therefore, on exposing the shot area SA(1, 2) stepping is performed in consideration of the expansion described above to position the central point of the shot area SA(1, 2) to be:

$$(40 \cdot (1+\alpha \cdot E/C)mm, \ -60 \cdot (1+\alpha \cdot E/C)mm)$$

That is, the stepping amount of the wafer W is to be $20(1-(\alpha \cdot E/C))$ mm in the row direction (−X direction), and $60(\alpha \cdot E/C))$ mm in the column direction (−Y direction).

When the projection magnification of the projection optical system PL in exposure on the shot area SA(1, 1) is determined as $\beta_1$ by the main controller 20, the projection magnification $\beta_2$ of the projection optical system PL on exposing the shot area SA(1, 2) is calculated according to equation (2) below:

$$\beta_2 = \beta_1 (1+(\alpha \cdot E/C)) \quad (2)$$

And, the main controller 20 controls the projection optical system PL via the image forming characteristics correction controller 68, and sets the projection magnification of the projection optical system PL to $\beta_2$ The main controller 20 then controls the wafer stage WST through the stage control system 19, wafer driving unit 21 based on the positional information (or velocity information) from the wafer interferometer 31. And upon setting the ratio of the moving velocity of the reticle R and the wafer W in respect to the thermal expansion of the wafer W, scanning exposure is performed in the same manner as of the shot area SA(1, 1) (except for the scanning direction that is reversed). As a consequence, the shot area SA(1, 2) is exposed at a position slightly farther off from the center of the wafer W than the expected position of the designed shot area SA(1, 2).

When the transfer of the reticle pattern onto the shot area SA(1, 2) is completed, the wafer W is stepped, by one shot area. The exposure design position of the central point of the shot area SA(1, 3) which is subject to the third exposure is (−20 mm, −60 mm), as described earlier. The wafer W and wafer holder 25, however, have expanded by ($2\alpha \cdot E/C$) due to exposure on the shot area SA(1, 1) and shot area SA(1, 2). Therefore, on exposing the shot area SA(1, 3), stepping is performed in consideration of the expansion to position the central position of the shot area SA(1, 3) to be:

$$(20 \cdot (1+2\alpha \cdot E/C)mm, \ -60 \cdot (1+2\alpha \cdot E/C)mm)$$

That is, the stepping amount of the wafer W is to be 20 mm in the row direction (−X direction) and to $60(\alpha \cdot E/C)$ mm in the column direction (−Y direction).

And, the main controller 20 calculates the projection magnification $\beta_3$ of the projection optical system PL on exposure of the shot area SA(1, 3) from the equation (3) below:

$$\beta_3 = \beta_1 \cdot (1+2(\alpha \cdot E/C) \quad (3)$$

The main controller 20 then controls the projection optical system PL via the image forming characteristics correction controller 68 and sets the projection magnification of the projection optical system PL to $\beta_3$. After the magnification is determined, the main controller 20 controls the wafer stage WST via the stage control system 19, wafer driving unit 21 based on the positional information (or velocity information) from the wafer interferometer 31, thereby performing scanning exposure in the same manner as of the shot area SA(1, 1) while setting the ratio of the moving velocity of the reticle R and the wafer W in respect to the thermal expansion of the wafer W.

Subsequently, in the same manner, the wafer W is stepped to a position $(X'_i, Y'_j)$ which is obtained by correcting the central point of the designed position $(X_i, Y_j)$ of the shot area SA(i, j) obtained by equation (1), in consideration of the expansion of the wafer W. In this case, the position $(X'_i, Y'_j)$ is calculated by the equations (4) and (5) when the shot area SA(i, j) is the nth shot area in the exposure sequence:

$$X'_i = X_i \cdot (1+(n-1) \cdot (\alpha \cdot E/C)) \quad (4)$$

$$Y'_j = Y_j \cdot (1+(n-1) \cdot (\alpha \cdot E/C) \quad (5)$$

In the case three shot areas are consecutively exposed in the row direction (X-axis direction). When the interval between the shot area to be exposed first and the next shot area is represented by $(dX_1, dY_1)$, and the interval between the second shot area and the third shot area is represented by $(dX_2, dY_2)$, obviously, these distances have the following relationship:

$$|dX_2-dX_1| = \Delta x_0 \cdot (\alpha \cdot E/C) = 20(\alpha \cdot E/C)[mm] \quad (6)$$

$$|dY_2-dY_1| = 0[mm] \quad (7)$$

That is, when shot areas are to be consecutively exposed in the row direction (X-axis direction), the stepping amount for a shot area in the row direction is larger than the stepping amount of the preceding shot area in the row direction by the amount calculated in equation (6). The stepping amount in the column direction is constant as indicated in equation (7).

In addition, a projection magnification $\beta_n$ on exposure of the nth shot area in the exposure sequence is obtained by $$\beta_n = \beta_1 \cdot (1+(n-1) \cdot (\alpha \cdot E/C) \quad (8)$$

Each time the shot area is renewed as a subject to exposure, the projection magnification of the projection optical system PL is determined via the image forming characteristics correction controller 68.

Scanning exposure is thus sequentially performed on respective shot areas in the same manner as that of the shot area SA(1, 1) (in some cases only the scanning direction is reversed) while the stepping of the wafer W, the projection magnification of the projection optical system PL, the moving velocity ratio of the wafer W and the reticle R are changed. Exposure is performed up to the shot area SA(7, 7) which is the last shot area.

When exposure on the first layer is completed in this manner, developing, etching, and like are performed, and exposure is then performed on the second layer of the wafer W which is coated with a resist. On exposing the second layer, the reticle R on which the pattern for the second layer is formed is loaded onto the reticle stage RST by the reticle loader. As with the exposure on the first layer, the amount of exposure light reaching the wafer stage WST is measured by the light amount sensor 48. And the main controller 20 calculates the thermal energy E generated in the wafer W upon exposure on one shot area of the second layer based on the measurement result obtained by the light amount sensor 48. The main controller 20 also calculates the thermal expansion ($\alpha \cdot E/C$) of the wafer W caused by exposure on one shot area by using the total thermal capacity C of the wafer holder 25 and wafer W and the linear expansion coefficient $\alpha$.

Next, the wafer W to be exposed is loaded onto the wafer stage WST by the wafer loader. The main controller 20 then prepares for reticle alignment and baseline measurement in accordance with a predetermined procedure by using a reference mark plate (not shown in FIGS.) on the wafer stage WST. And then, alignment measurement such as EGA (Enhanced Global Alignment) using the position detecting system (70, 72) is performed. This embodiment uses the EGA method disclosed in, for example, U.S. Pat. Nos. 4,780,617 and 4,962,318. The disclosures described above are fully incorporated by reference herein.

That is, a plurality of shot areas (including three shot areas that are not located on the same straight line) are selected as alignment shots from multiple shot areas on the wafer W, and the positions of the alignment marks provided on the plurality of alignment shots are respectively detected. In addition, by a statistical calculation (e.g., least-squares method) using the detected mark positions, parameters for a model function representing the shot arrangement on the wafer W can be calculated. And based on the parameter, the coordinate positions of multiple shot areas are determined as movement information. When the alignment measurement is completed, as with the case of exposing the first layer, the coordinate position determined in accordance with the thermal expansion of the wafer W is corrected. The projection magnification of the projection optical system PL is also adjusted, and, respective shot areas are exposed in sequence. Thus, exposure is performed on the second layer. Subsequently, exposure on the third and subsequent layers is sequentially performed in the same manner as that of the exposure on the second layer.

According to this embodiment, on exposing each shot area, the exposure position of the wafer W is controlled in accordance with the thermal expansion of the wafer W during exposure on each shot area. This makes it possible to arrange the respective shot areas at the designed position on the wafer in a cooled state after exposure. As a consequence, high overlay accuracy can be ensured. Furthermore, regardless of the exposure sequence used for each layer, multilayer exposure can be performed while maintaining high overlay accuracy.

In addition, since the thermal expansion of the wafer W is calculated using a simple function, i.e., a linear function with the number of shot areas which have completed exposure on the layer performing exposure as a variable, exposure precision can be easily improved. Furthermore, on exposing each shot area, the projection magnification of the projection optical system PL is variably controlled in respect to the thermal expansion of the wafer W, as well as the moving velocity ratio of the wafer W and the reticle R. This can make the pattern size of the first layer transferred onto the respective shot areas on the wafer W identical, when the wafer is cooled after exposure. As a consequence, the magnification errors between the patterns that have already been formed in the respective shot areas and the patterns of the second and subsequent layers can be reduced to almost zero, thus ensuring a high overlay accuracy.

In this embodiment, when the reticle pattern of the first layer are to be respectively transferred onto multiple shot areas on the wafer W, the projection magnification of the projection optical system PL is set to ⅕ (¼ or ⅙) for the first shot area. The velocity ratio between the reticle R and the wafer W is also set to a value that correspond to the projection magnification. For the second and subsequent shot areas, to make the size of the multiple shot areas on the wafer identical, the projection magnification of the projection optical system PL is adjusted in accordance with the thermal expansion of the wafer W, since the wafer W contracts after the exposure process. Thus, the magnification of the transferred image of the reticle pattern in the non-scanning direction (row direction, i.e., X direction) of the wafer W is corrected. And, the magnification of the transferred image in the scanning direction (column direction, i.e., Y direction) is corrected by adjusting the projection magnification of the projection optical system PL and the velocity ratio between the reticle R and the wafer W.

In the case of overlaying and transferring a reticle pattern of the second or subsequent layer on pattern already formed on a shot area on the wafer W, the magnification error between the transferred image of the reticle pattern and the pattern on the wafer W in the non-scanning direction of the wafer is corrected by adjusting the projection magnification of the projection optical system PL. This adjustment is performed based on a scaling parameter representing the extension and contraction of the wafer W and the thermal expansion of the wafer W on exposure, which parameters are among the parameters of the model function calculated by the EGA method. Also, based on the scaling parameter representing the extension and contraction of the wafer W and the thermal expansion of the wafer W on exposure, the velocity ratio of the reticle R and the wafer W is adjusted. And by this adjustment, the magnification error between the transferred image of the reticle pattern and the pattern on the wafer W in the scanning direction of the wafer W is corrected.

The adjusted velocity ratio between the reticle R and the wafer W on transferring any reticle pattern of the first, second, or subsequent layer, does not always match the adjusted projection magnification. And, if the projection magnification of the projection optical system PL is adjusted, not only does the magnification of a partial projection image of a reticle pattern in the non-scanning direction of the wafer W change, but also the magnification in the scanning direction of the wafer W changes. That is, the width of the illumination light for exposure on the wafer W (a rectangular area in which a partial projection image of a reticle pattern is formed) changes in the scanning direction.

Therefore, a preferable exposure dose in respect to the sensitivity of the photoresist may not be provided for each point in each shot area on the wafer W. In this case, the scanning exposure condition of the wafer W may be adjusted in accordance with a change in the projection magnification of the projection optical system PL. If, for example, the illumination light for exposure is a pulse light, at least one of the scanning speed of the wafer W, the oscillation frequency of the light source which oscillates the pulse light, the pulse light intensity on the wafer W, or the pulse light width in the scanning direction is to be adjusted. In the case the illumination light for exposure is a continuous light, at least the scanning speed of the wafer W, the continuous light intensity on the wafer W, and the continuous light width in the scanning direction is adjusted.

In this embodiment, for the sake of simplicity, the coordinate position corrected in respect to the thermal expansion of the wafer W (equation (4) and (5)) is a coordinate value in which the central point of each shot area on the wafer W coincides with the optical axis AX of the projection optical system PL. And, the wafer W is stepped so that the central point of each shot area coincides with the respective correction coordinate values. In the scanning exposure apparatus, however, the wafer W must be accelerated to a predetermined velocity before starting scanning exposure and a predetermined approach distance is required for the acceleration. Accordingly, the wafer W is stepped so that each shot area on the wafer W is positioned apart from a rectangular area (to be referred to as a "projection area" hereinafter), to secure the predetermined approach distance in the column direction (Y direction). In the rectangular area, a partial projection image of a reticle pattern is formed within the circular image field of the projection optical system PL. That is, when scanning exposure on one shot area is completed, the wafer W (i.e., the wafer stage WST) then decelerates and moves along in the Y direction until it arrives where it is spaced apart in the predetermined approach distance from the projection area of the reticle pattern to be transferred in the next shot area. The wafer W is also moved along the X direction so that the central point of the next shot area coincides with the coordinate position (equation (4)) in the X direction that is corrected as described above. Thus, the wafer is positioned at the approach starting position of the next shot area. After the wafer W (wafer stage WST) is then accelerated to a predetermined velocity (moving velocity in scanning exposure), and begins scanning exposure on the next shot area.

The approach distance is uniquely determined by the acceleration of the wafer stage WST and the moving velocity of the wafer W in scanning exposure operation. In consideration of throughput, however, the acceleration of the wafer stage WST is preferably set to its maximum value so as to minimize the approach distance. And the approach starting position of each shot area on the wafer W in the Y direction is determined by the approach distance and the size of each shot area in the Y direction, based on the coordinate position (equation (4)) in the Y direction being corrected as described above.

As described previously, when the step-and-scan method is used to perform scanning exposure respectively of the multiple shot areas on the wafer W, the movement of the wafer W (wafer stage WST) stops in between decelerating after completing exposure of a shot area and the stepping of the wafer W in the X direction, and in between the stepping of the wafer in the X direction and acceleration before starting scanning exposure on the next shot area. In consideration of throughput, however, the wafer W is preferably moved without stopping between scanning exposure on two shot areas. In other words, the wafer W is preferably moved so that the velocity components in the X and Y directions are not equal zero. More specifically, stepping (acceleration) of the wafer W in the X direction is to be started before the velocity component of the wafer W in the Y direction becomes zero after completing scanning exposure on one shot area, while the acceleration of the wafer W in the Y direction is to start before the velocity component of the wafer W in the X direction becomes zero. As a consequence, the locus of the wafer W becomes almost parabolic (U shaped). The timing to start the stepping of the wafer W in the X direction may be set before starting deceleration of the wafer W after scanning exposure, or after the start of deceleration. In addition, the timing to start the acceleration of the wafer W in the Y direction may be set during acceleration of the wafer W in the X direction (before starting deceleration) or after starting deceleration. Furthermore, in the embodiment, stepping (acceleration) of the wafer W in the X direction is to be started before the velocity component of the wafer W in the Y direction becomes zero after completing scanning exposure on one shot area, while-the acceleration of the wafer W in the Y direction is to start before the velocity component of the wafer W in the X direction becomes zero. The wafer W can be accelerated in only one direction, and in this case as well, the throughput can be improved.

Second Embodiment

A scanning exposure apparatus and method according to the second embodiment of the present invention will be described below with reference to FIGS. 5 and 6. The first embodiment employs the model in which thermal energy generated by exposure is quickly conducted in the wafer W and wafer holder 25 so as to totally expand the wafer W and wafer holder 25 in uniform. In contrast to this, in the second embodiment, a model in which the thermal energy to be conducted in the wafer W and wafer holder 25 takes some time to expand is considered. Components identical or equivalent to those described in connection with the first embodiment are designated with the same reference numerals, and the discussion thereabout is briefly made or is entirely omitted.

The scanning exposure apparatus of this embodiment, as in the first embodiment, is an apparatus, which performs scanning exposure by synchronously moving a reticle R and the wafer W while moving the wafer W in the +Y and −Y directions during scanning. It has the same arrangement as that of the exposure apparatus 100 in FIG. 1.

Similar to the first embodiment, the arrangement of the shot areas are designed (49 shot areas laid out in the form of a 7×7 matrix) on the wafer W as shown in FIG. 3, and are exposed in an exposure sequence as shown in FIG. 3.

The expansion mechanism of the wafer W and wafer holder 25 due to thermal energy caused by exposure irradiation, to which this embodiment is applied, will be described. As described above, this embodiment employs the model in which the thermal energy to be conducted in the wafer W and wafer holder 25 takes some time to expand. Accordingly, of exposures on shot areas which have already been performed on a layer, the wafer expansion caused by the thermal energy generated on exposure on the shot area that is spatially and temporally close, is in the form of expansion of a local area of the wafer W including the shot area already exposed. And in the case when thermal expansion of the wafer W due to thermal energy generated by exposure on a shot area is spatially or temporally far from the shot area to be exposed, it shows in the form of thermal expansion of the wafer W as a whole. In actual, the wafer W, the diffusion speed of the thermal energy generated in a shot area on the wafer W on exposure is not so fast, therefore, these assumptions are an excellent approximation to actual thermal expansion.

That is, when a shot area SA(1, 1) is subject to first exposure, and the adjacent shot area SA(1, 2) is to be exposed next, the thermal energy generated on exposure on the shot area SA(1, 1) does not reach the shot area SA(1, 2) although it is conducted from the wafer W to the wafer holder 25. The expansion, therefore, of the area around the central point of the shot area SA(1, 2) is still small. A similar tendency can be seen up to the shot area SA(1, 7) which is to be exposed last in the first row.

However, by the time exposure on the second row starts, the thermal energy generated in the first row on previous exposure reaches the second row, and the wafer W and wafer holder 25 expands due to the influence of the thermal energy. By the time the exposure sequence approaches the second half of the shot area of the second row, the thermal energy generated in the first half of the exposure process on the first row has already reached the second row, and diffused into the third and fourth rows. In other words, the temperature of the wafer W and wafer holder 25 during exposure on the second half of the second row has decreased than that of exposure on the first half of the second row.

As a consequence, the local thermal expansion of the wafer W and wafer holder 25 is slightly smaller than that in the first half of the second row. Likewise, the local thermal expansion of portions of the wafer W and wafer holder 25 which correspond to the first shot on each row is large, and gradually decreases as exposure proceeds through the subsequent columns.

From the viewpoint of the overall wafer W, the thermal expansion of the wafer W and wafer holder 25 gradually increases as exposure proceeds from the first to the second and subsequent rows, due to the thermal energy generated on exposure of preceding rows which is conducted to subsequent rows.

In short, the wafer W and wafer holder 25 gradually expands in general, and local thermal expansion is large at the first column of each row, gradually decreasing as exposure proceeds to the last column.

Figure 5:
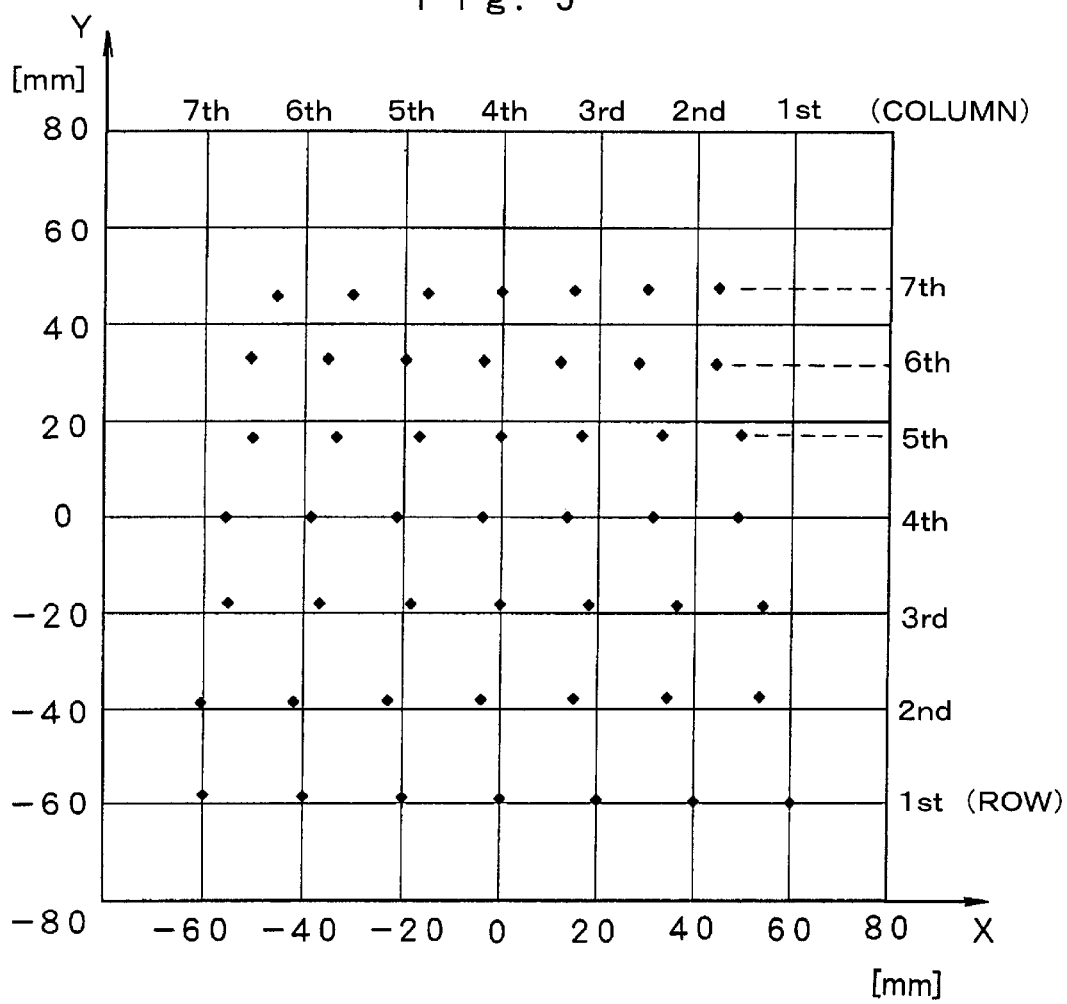
FIG. 5 is a graph for explaining shot area arrangement deviations in a thermal expansion model in the second embodiment.

FIG. 5 shows how the respective shot positions are arranged when exposure on each shot area is performed based on the expansion model in this embodiment. The stepping amount in the row direction set to 20 mm, and the stepping amount in the column direction also set to 20 mm, and the temperature of the exposed wafer is restored to the initial temperature. In FIG. 5, similar to FIG. 4, the central point of each shot area is represented by a "♦", and the illustration of the shape of each shot area is omitted. As shown in FIG. 5, similar to the model shown in the first embodiment, the position of each shot area deviates inwardly from the designed position.

Figure 6:
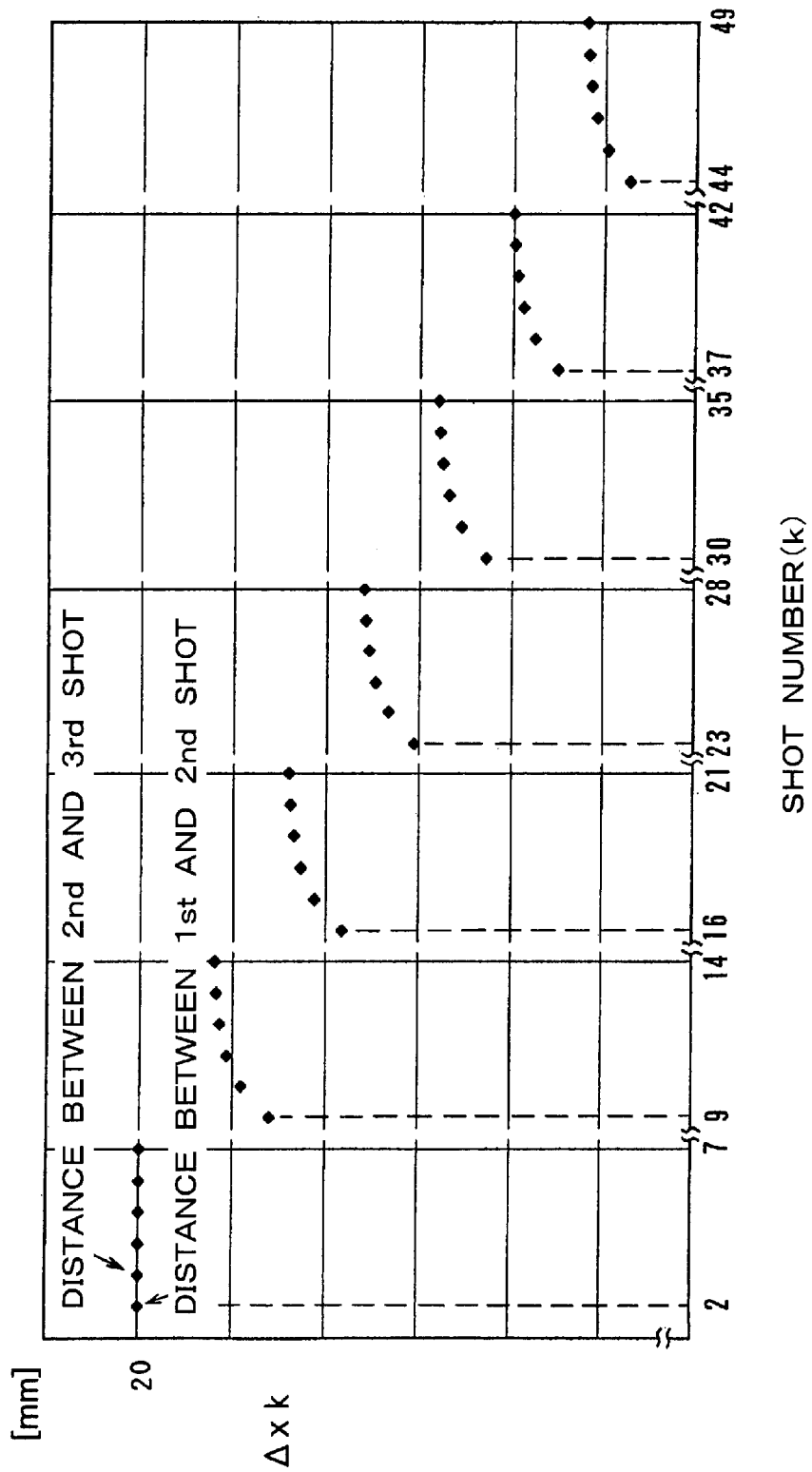
FIG. 6 is a graph showing changes in the intervals between shot areas in the row direction in respect to the shot area arrangement deviations in FIG. 5.

FIG. 6 shows the interval (the X-axis direction only) between each shot area and the shot area previously exposed according to the model in this embodiment. In FIG. 6, the horizontal axis represents the shot number, i.e. the exposure sequence number. As shown in FIG. 6, since the wafer W and wafer holder 25 continues to expand as a whole, the intervals between the respective shot areas after the wafer has cooled off gradually decrease as in the first embodiment. However, when considering only the shot areas in the same row, the intervals between the shot areas gradually increase. The increase in shot area intervals within the same row, becomes smaller as exposure proceeds to the subsequent columns, and the difference between a shot area interval and the preceding shot area interval is extremely small near the last column on each row. The expansion in the Y direction, is substantially the same as in the first embodiment.

In this embodiment, the following three values must be obtained in advance: an overall expansion value during exposure on the wafer W, a local expansion value at an intra-row level, and an expansion value when shifting from one row to another row. The values may be actually obtained in advance by exposing the wafer under a certain condition, and can be calculated in situ afterward in accordance with the shot area arrangement, exposure time (i.e., exposure light amount), and the like. Obviously, other than actually performing exposure, the values can be obtained by a computer simulation based on the thermal conductivity of the material and structures of the wafer W and wafer holder 25, expansion coefficient, and the like.

In the case of performing test exposure, for example, measurement patterns are formed on a measurement reticle which is transferred onto a plurality of shot areas on a measurement wafer without considering the thermal expansion of the wafer W. The measurement wafer is then cooled, and the distances between the transferred patterns are measured. And based on the results, the thermal expansion of the wafer W can be obtained.

An exposure method according to the embodiment using the exposure apparatus 100 will be described below.

To obtain the thermal expansion of the wafer W or the like as described above, in this embodiment, prior to exposure of each layer preparation to calculate the thermal expansion must be completed. The preparation is performed by using the thermal energy generated in the wafer W by exposure on one shot area as a parameter, which is obtained by preliminary measurement or computer simulation.

In this embodiment, first of all, exposure of the first layer is performed. On exposing the first layer, the reticle R on which patterns for the first layer are formed is loaded on a reticle stage RST by a reticle loader (not shown in Figs.). A light amount sensor 48 is then moved below a projection optical system PL. The light sensor 48 is moved by a main controller 20 via a stage control system 19, wafer driving unit 21, and the like.

Next, a light source 1 emits an illumination light. The light amount sensor 48 measures the amount of exposure light that has reached a wafer stage WST. The main controller 20 obtains the thermal energy E generated in the wafer W of exposure on one shot area based on the measurement result sent from the light amount sensor 48 and the like. The main controller 20 also obtains the thermal expansion information of the wafer W and wafer holder 25 in respect to the first layer.

Then, the wafer W to be exposed is loaded onto the wafer stage WST by using a wafer loader (not shown in FIGS.). The main controller 20 controls the wafer stage WST through the stage control system 19, wafer driving unit 21, and the like based on positional information (or velocity information) from a wafer interferometer 31. Similar to the first embodiment, the main controller 20 drives the wafer stage WST so that it is positioned to a scanning starting position which is determined by the position of the central point of the first shot area. The central point of the first shot area is at (60 mm, −60 mm) in the wafer coordinate system. At the same time, the reticle stage RST is moved so that the X-Y position of the reticle R is set to the scanning starting position.

The stage control system 19 performs scanning exposure by relatively moving the reticle R and wafer W while adjusting the plane position of the wafer W via a reticle driving portion (not shown in FIGS.) and the wafer driving unit 21. The adjustment is performed based on the Z-position information and tilt information of the wafer detected by a multiple focal position detection system (51, 52), the X-Y position information of the reticle R measured by a reticle interferometer 16, and the X-Y position information of the wafer W measured by the wafer interferometer 31.

When the transfer of the reticle pattern onto the shot area SA(1, 1) is completed by the scanning exposure performed and controlled as described above, the wafer W is stepped, by one shot area.

The stepping is performed in consideration of the thermal expansion information of the wafer W and wafer holder 25 which is obtained prior to exposure on the first layer. For example, if a shot area interval $\Delta x_k$ is obtained in advance as the thermal expansion information in respect to the X-axis direction, an actual shot area interval $\delta x_2$ can be calculated from a design shot area interval $\Delta x_0$ (=20 mm) and shot area interval $\Delta x_2$. That is, the actual shot area interval $\delta x_2$ is obtained by $$\delta x_2 = \Delta x_{02}/\Delta x_2 \qquad (9)$$

and stepping is performed by this value in the X-axis direction. Stepping is also performed in the Y direction based on the thermal expansion information.

As in the first embodiment, the projection magnification of the projection optical system PL and the moving velocity ratio of the wafer W and the reticle R are changed in accordance with the thermal expansion, and scanning exposure is performed on the shot area SA(1, 2) as with the shot area SA(1, 1) (except for the scanning direction that is reversed).

Subsequently, the actual shot area interval $\delta x_k$ is obtained for each shot area from a shot area SA(1, 3) to a shot area SA(7, 7) by $$\delta x_k = \Delta x_{02}/\Delta x_k \qquad (10)$$

and stepping is performed in accordance with the obtained value in the X-axis direction. Stepping is also performed in the Y direction based on the thermal expansion information.

As is obvious from FIG. 6 and the equation (10), the actual shot area interval in this embodiment gradually increases from the viewpoint of the overall wafer, but gradually becomes smaller within the same row as a new shot area is subject to exposure. In addition, when exposure on one row is completed, the position of the first shot area on the next row is to be slightly shifted from the position of the shot area on the preceding row toward the circumference of the wafer W. This is because the thermal energy generated by exposure on the preceding row is conducted to some extent in between the end of exposure on the preceding shot area and the beginning of exposure on the shot area and the wafer W and wafer holder 25 expands.

Scanning exposure is then sequentially performed on the respective shot areas, as with the shot area SA(1, 1) (only the scanning direction is reverse sometimes), while the projection magnification of the projection optical system PL and the moving velocity ratio of the wafer W and the reticle R are changed in accordance with the thermal expansion.

When exposure on the first layer is completed as described above, exposure on the second layer is performed. Similar to the first embodiment, prior to exposure on the second layer, the reticle R on which patterns for the second layer are formed is loaded on the reticle stage RST by the reticle loader. As with the case of exposure on the first layer, the amount of exposure light that has reached the wafer stage WST is measured by the light amount sensor 48. The main controller 20 then obtains the thermal energy E generated in the wafer W on exposure on one shot area in exposure on the second layer, based on the measurement result of the light amount sensor 48 and the like. The main controller 20 also obtains the thermal expansion information of the wafer W and wafer holder 25 in respect to the second layer.

As in the first embodiment, the wafer W to be exposed is loaded on the wafer stage WST by the wafer loader. Subsequently, similar to the first embodiment, the main controller 20 performs prepares for reticle alignment and baseline measurement by using a reference mark plate (not shown) on the wafer stage WST in accordance with a predetermined procedure. Then alignment measurement such as EGA by using a position detecting system (70, 72) is performed. After the alignment measurement is completed, exposure is sequentially performed on the respective shot areas, thus exposing the second layer, as in the exposure on the first layer. Exposure on the third and subsequent layers is sequentially performed similar to the exposure on the second layer.

According to this embodiment, as with the first embodiment, on exposing each shot area, the exposure position of the wafer W is controlled in accordance with the thermal expansion of the wafer W on exposure of each shot area. Therefore, the shot areas can be accurately arranged on the wafer in the form of a matrix in a cooled state after exposure. In addition, multilayer exposure can be performed while ensuring high overlay accuracy, regardless of the exposure sequence employed for the respective layers.

In addition, since the thermal expansion of the wafer W is obtained on the assumption that it takes a certain period of time for the thermal energy generated by previous exposure on one layer to be transmitted to another layer, exposure can be performed with an extremely high precision. On exposing each shot areas, the projection magnification of the projection optical system PL is variably controlled in accordance with the thermal expansion of the wafer W. And, the moving velocity ratio of the wafer W and the reticle R is variably controlled in accordance with the expansion amount of the wafer W. This can make the pattern size transferred onto the respective shot areas on the wafer W identical, when the wafer is cooled after exposure, thus ensuring a high overlay accuracy.

An embodiment of a device manufacturing method using the exposure apparatus and method above will be described.

Figure 7:
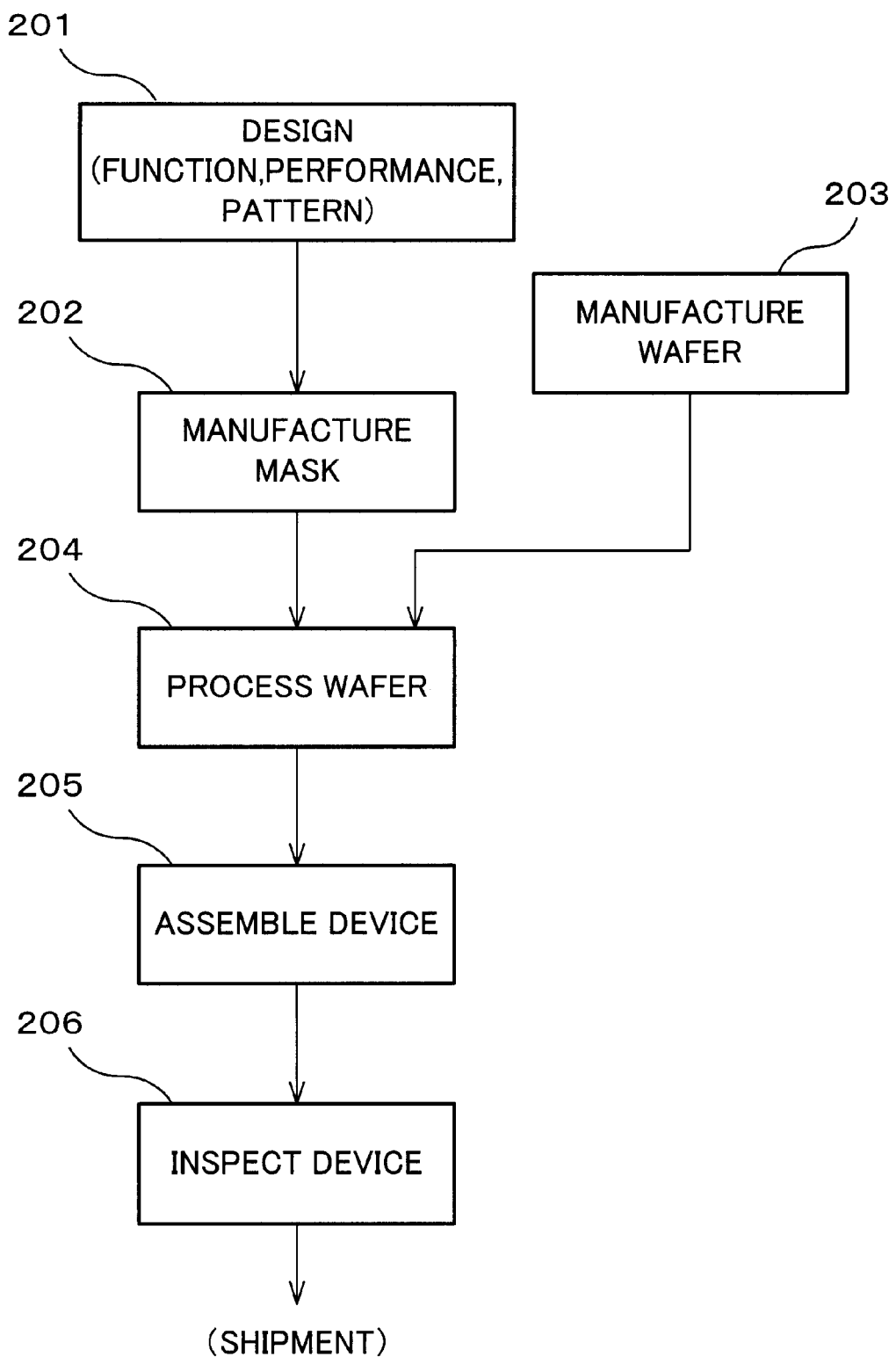
FIG. 7 is a flow chart for explaining an embodiment of a device manufacturing method according to the present invention.

FIG. 7 is a flow chart showing an example of manufacturing a device (a semiconductor chip such as an IC or LSI, a liquid crystal panel, a CCD, a thin film magnetic head, a micromachine, or the like). As shown in FIG. 7, in step 201 (design step), function/performance is designed for a device (e.g., circuit design for a semiconductor device) and a pattern to implement the function is designed. In step 202 (mask manufacturing step), a mask on which the designed circuit pattern is formed is manufactured. In step 203 (wafer manufacturing step), a wafer is manufacturing by using a silicon material or the like.

In step 204 (wafer processing step), an actual circuit and the like are formed on the wafer by lithography or the like using the mask and wafer prepared in steps 201 to 203, as will be described later. In step 205 (device assembly step), a device is assembled by using the wafer processed in step 204. Step 205 includes processes such as dicing, bonding, and packaging (chip encapsulation).

Finally, in step 206 (inspection step), a test on the operation of the device, durability test, and the like are performed. After these steps, the device is completed and shipped out.

Figure 8:
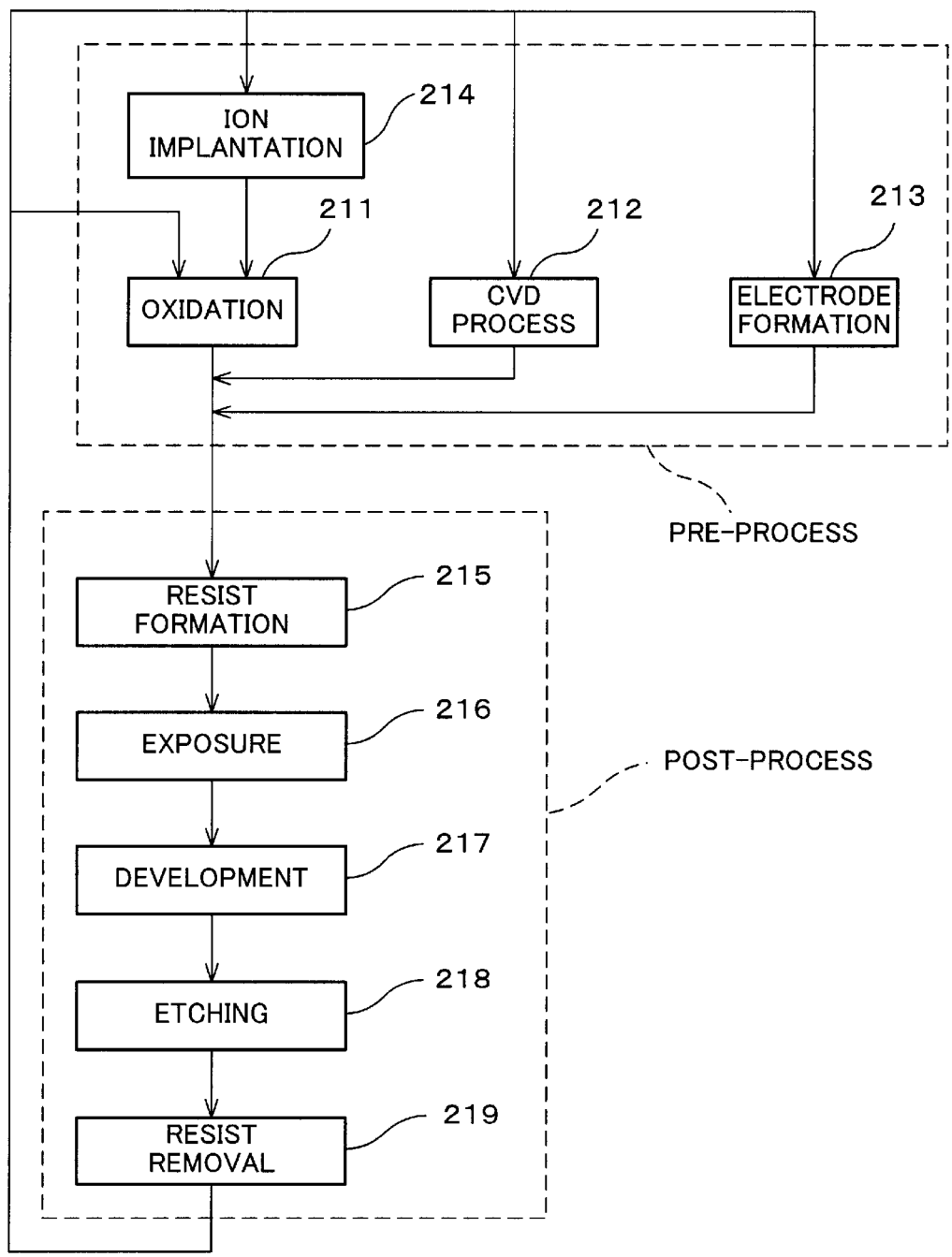
FIG. 8 is a flow chart showing the processing in step 204 in FIG. 7.

FIG. 8 is a flow chart showing a detailed example of step 204 described above in manufacturing the semiconductor device. Referring to FIG. 8, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 215 (resist formation step), the wafer is coated with a photosensitive agent. Next, as in step 216, the circuit pattern on the mask is transcribed onto the wafer by the above exposure apparatus and method. Then, in step 217 (developing step), the exposed wafer is developed. In step 218 (etching step), an exposed member on a portion other than a portion where the resist is left is removed by etching. Finally, in step 219 (resist removing step), the unnecessary resist after the etching is removed.

By repeatedly performing these pre-process and post-process, multiple circuit patterns are formed on the wafer.

A high-integration device, which was conventionally difficult to manufacture, can be manufactured by using the device manufacturing method of this embodiment.

In each of the embodiment, only the wafer is moved in accordance with the thermal expansion to correct the exposure position (the scanning exposure start position in the scanning exposure apparatus) of each shot area. However, the position of the reticle R (the scanning exposure start position in the scanning exposure apparatus) may be adjusted in accordance with the thermal expansion of the wafer W instead of correcting the exposure position of each shot area. Alternatively, both the reticle R and the wafer W can be moved to cancel out the alignment errors caused by the thermal expansion of the wafer W.

In each embodiment described above, the magnification of the reticle pattern image is changed by adjusting the projection magnification of the projection optical system PL. However, if the projection optical system PL which is non-telecentric on the reticle R side is to be used, the magnification of the reticle pattern image may be changed by moving the reticle R along the optical axis. In a scanning type projection exposure apparatus based on the step-and-scan method which uses EUV (Extreme UltraViolet) light having an oscillation spectrum in the range of 5 to 15 nm (the soft X-ray region) as exposure illumination light, an illumination area on a reflection type mask is an arcuated-shaped slit. The apparatus has a reduction projection optical system structured of only a plurality of (about four) reflection optical elements (mirrors). And the pattern on the reflection type mask is transferred onto a wafer by the reflection type mask and the wafer synchronously moving at a velocity ratio corresponding to the magnification of the reduction projection optical system. On exposure, EUV light is irradiated on the reflecting mask with the principal ray of the EUV light tilting with respect to an axis perpendicular to the reflection type mask. Accordingly, with a projection exposure apparatus using EUV light, the reflection type mask moves along an axis perpendicular to the pattern surface in order to adjust the magnification of a pattern image on the wafer.

In each embodiment described above, only the magnification of the reticle pattern image is adjusted to reduce the magnification error between the transferred image of a reticle pattern on the second or subsequent layer and the pattern on the wafer to almost zero. However, in the case the wafer W is distorted by thermal expansion, the distortion of the reticle pattern image may be adjusted. The image distortion can be adjusted by, for example, moving at least one optical element of the projection optical system PL, or moving the reticle R along the optical axis.

With the scanning type projection exposure apparatus, in particular, the reticle R and wafer W are synchronously moved to make the scanning direction of the reticle R. To be more precise, the reticle R and wafer W are synchronously moved to make the scanning locus on the wafer W of one point on the reticle R parallel to the scanning direction (Y direction) of the wafer W during scanning exposure. In the case where a transferred image of a reticle pattern on the wafer W is actively distorted, the reticle R and wafer W may be synchronously moved so as to make the scanning locus intersect the scanning direction of the wafer W. To make the scanning locus of one point on the reticle R intersect on the wafer W with the scanning direction of the wafer W, either the scanning direction of the reticle R or the wafer W may be corrected to make the angle between both directions preferable.

Also, during scanning exposure, the magnification (width) of a partial projection image of a reticle pattern in the non-scanning direction may be changed continuously or sequentially. Furthermore, the reticle R and the wafer W may be synchronous moved while the reticle pattern and the corresponding shot area on the wafer W are relatively rotated slightly.

In each embodiment, the exposure sequence based on the row zigzag method has been described. However, as a matter of course, the present invention can be applied to an exposure sequence based on the column zigzag method. The shot area arrangement is described only as a 7×7 square matrix, however, the shot area intervals in the row and column directions do not have to be equal, and the number of columns may differ depending on the rows. Since the first embodiment uses the model in which the thermal energy generated by exposure is quickly conducted through the wafer holder in uniform, the respective equations in the first embodiment can be practically used without any modification. The second embodiment can also be basically used without any modification.

In obtaining thermal energy generated on exposure of one shot area, the energy of exposure light that reaches the wafer stage WST is detected by using the light amount sensor 48 prior to exposure on each layer. Furthermore, a variation in the energy of exposure light that has reached the wafer stage WST during exposure may be detected by using the light amount sensor 53, which can be reflected in the next stepping operation.

On exposure of the second and subsequent layers, the stepping amount is obtained from the array coordinates of a shot area on the wafer W obtained by EGA prior to exposure in consideration of thermal expansion. However, the coordinate values of the EGA designed shot area can be used as values in consideration of thermal expansion, which results in a multilayer exposure while securing high overlay accuracy compared with conventional exposure.

On performing text exposure, the temperature of a measurement wafer prior to pattern transfer can be the temperature set when the wafer W is loaded on the substrate stage on exposure. In addition, the measurement wafer may be or may not be cooled by using a cooling unit. Alternatively, the temperature of the wafer may be lowered to the temperature prior to pattern transfer through the same processes (PEB, cooling, and the like) as in actual exposure. In the latter case, in particular, since the measurement wafer is thermally affected as in actual exposure operation, the thermal expansion of the wafer W can be accurately obtained. This makes it possible to secure high overlay accuracy.

The same effects as described above can also be obtained by applying the present invention to a so-called stitching exposure, in which patterns are respectively transferred onto a plurality of shot areas where peripheral portions overlap one another on the wafer W to form one large pattern. The present invention can also be applied to multiple exposure (double exposure), in which the same shot area on the wafer W is exposed at least twice. With stitching exposure or double exposure, when the reticle is exchanged especially between the first and second patterns, in consideration of throughput, the second pattern is usually transferred and all shot areas are exposed after all the shot areas on the wafer W have the first pattern to exposed transferred. Accordingly, in the wafer W that has the first pattern formed and transferred, the thermal energy generated on exposure is accumulated. And in the case where the accumulation of thermal energy due to the transfer of the first pattern cannot be neglected when the second pattern is to be transferred, each embodiment described above is preferably performed in consideration of the accumulation of the thermal energy. When stitching exposure or double exposure is performed using three or more patterns, the same operation is performed for the third and subsequent patterns.

The projection optical system PL is not limited to the refraction system and it may be a reflection system structured of only reflection optical elements or a reflection/refraction system having both reflection optical elements and refraction optical elements. Furthermore, the projection optical system PL is not limited to a reduction magnification system and may be an equal magnification type or enlarged magnification type.

As for the illumination light IL, a harmonics may be used, which is obtained by amplifying a single-wavelength laser beam in the infrared or visible range which is emitted by a DFB semiconductor laser or a fiber laser, with a fiber amplifier doped with erbium (or both erbium and ytteribium), and then converting the wavelength into ultraviolet light using a nonlinear optical crystal.

In addition, as the illumination light IL, EUV (Extreme Ultraviolet) light having a wavelength in the soft X-ray region, e.g., 13.4 nm or 11.5 nm, hard X-rays, or a charged particle beam such as an electron beam or ion beam may be used.

In an electron beam exposure apparatus having an electron optics system for projecting a reduced image of a pattern formed on a mask, a circuit pattern to be transferred onto one shot area on the wafer W is divided into multiple small patterns and formed on the mask. While the mask and wafer are moved in the first direction, the electron beam is deflected to sequentially illuminate the small patterns arranged in the second direction, which is perpendicular to the first direction on the mask. The electron optics system then adjusts the transfer position of the reduced images of the small patterns on the wafer, and the reduced images of the small patterns are connected on one shot area, thereby forming a circuit pattern. The details of the electron beam exposure apparatus are disclosed in, for example, U.S. Pat. No. 5,624,774. The disclosure referred to above is fully incorporated by reference herein.

The present invention can also be applied to a case where this electron beam exposure apparatus is used to transfer a circuit pattern onto one shot area. That is, reduced images of many small patterns are arranged in one shot area in the shape of a matrix and on transferring the second and subsequent small patterns, and the wafer thermally expands by the thermal energy due to transferring the preceding small pattern. Therefore, during scanning exposure on a shot area, the position on the wafer at which the second or subsequent small pattern is to be transferred may be corrected by adjusting at least one of the positions of the mask and the wafer as described in each embodiment. In this case, the transfer position of the small pattern on the wafer may be corrected by deflecting the electron beam using the electron optics system, or, in addition to this correction, at least one of the positions of the mask and wafer may be adjusted.

On scanning exposure of the second and subsequent shot areas on the wafer in the electron beam exposure apparatus, similar to each embodiment described above, the transfer position of the small patterns on the wafer is preferably corrected in consideration of the thermal energy generated by exposure of the preceding shot area. Also, the transfer position of each small pattern may be corrected in consideration of the thermal expansion of the mask due to the irradiation of the electron beam. This can be applied in each embodiment described above.

The present invention can obviously applied to an exposure apparatus for transferring device patterns onto glass plates, which is used to manufacture displays including liquid crystal display devices and plasma displays, an exposure apparatus for transferring device patterns onto ceramic wafers, which is used to manufacture thin-film magnetic heads, an exposure apparatus used to manufacture image sensing devices (CCDs and the like), micromachines, and DNA chips, as well as manufacturing semiconductor devices. The present invention is not limited only to exposure apparatus such as a scanning exposure type (e.g., a step-and-scan method). The present invention can be applied to a static exposure type (step-and-repeat method) and the like, and can also be applied to a step-and-stitching method. In this method, a shot area may be exposed by either scanning or static exposure.

In addition, the present invention can be applied to an exposure apparatus for transferring a circuit pattern onto a glass substrate, silicon wafer, or the like to manufacture a reticle or mask which is used in a light exposure apparatus, an EUV (Extreme UltraViolet) exposure apparatus, an X-ray exposure apparatus, an electron beam exposure apparatus, and the like as well as manufacturing microdevices such as semiconductor elements. In this case, with an exposure apparatus using DUV (Deep Ultraviolet) light, VUV (Vacuum UltraViolet) light, or the like, a transmission type reticle is generally used. As a reticle substrate, silica glass, fluorine-doped silica glass, fluorite, magnesium fluoride, quartz, or the like is used. In a proximity type X-ray exposure apparatus, an electron beam exposure apparatus, or the like, a transmission type mask (stencil mask or membrane mask) is used, in the EUV exposure apparatus a reflection type mask is used, and a silicon wafer or the like is used as a mask substrate.

As has been described in detail, according to the exposure method of the present invention, exposing each divided area so that the respective shot areas are arranged on a substrate at desired intervals in a cooled state after exposure becomes possible. As a consequence, the overlay accuracy with respect to the next layer can be improved, as well as performing exposure with high overlay accuracy with respect to the preceding layer.

In addition, according to the exposure apparatus of the present invention, since each divided area is exposed using the exposure method of the present invention, the overlay accuracy can be improved with respect to the next layer. Thus, exposure can be performed with high overlay accuracy with respect to the preceding layer.

Furthermore, according to the device manufacturing method in the present invention, since the exposure method and apparatus of the present invention are used, a high-integrated device, which is difficult to manufacture conventionally, can be manufactured.

While the above-described embodiments of the present invention are the presently preferred embodiments thereof, those skilled in the art of lithography systems will readily recognize that numerous additions, modifications and substitutions may be made to the above-described embodiments without departing from the spirit and scope thereof. It is intended that all such modifications, additions and substitutions fall within the scope of the present invention, which is best defined by the Claims appended below.

What is claimed is:

1. An exposure method that sequentially transfers a pattern formed on a mask onto a plurality of divided areas arranged on a substrate along a predetermined direction, in an exposure sequence that proceeds to an adjacent divided area in said predetermined direction, said exposure method comprising:

correcting a movement information of said substrate for exposure of a next divided area so as to make a correction amount of a movement amount of said substrate smaller than a correction amount of a movement amount of said substrate on preceding exposure, while considering thermal distortion of said substrate due to exposure already performed on said substrate prior to a movement of said substrate for exposure of said next divided area on said substrate;

adjusting a positional relationship between said mask and said substrate for exposure of said next divided area, based on said corrected movement information; and exposing said next divided area, after adjusting said positional relationship.

2. The exposure method according to claim 1, wherein:

said divided areas are arranged on said substrate in a shape of a matrix, said exposure sequence proceeds to said adjacent divided area in a first row direction of said matrix, and when there is no adjacent divided area in said first row direction said exposure sequence then goes on to an adjacent row in a column direction of said matrix, and continues in a second row direction opposite to said first row direction, and said method further comprises increasing said correction amount of said movement amount of said substrate as said exposure sequence proceeds to said adjacent row in said column direction.

3. The exposure method according to claim 1, further comprising:

obtaining said movement information prior exposure on said substrate.

4. The exposure method according to claim 3, wherein said obtaining said movement information includes:

detecting positional information of a plurality of predetermined alignment marks that are among a plurality of alignment marks formed on said substrate with said plurality of divided areas; and obtaining positional information of said plurality of divided areas formed on said substrate by statistical calculation based on a result of said detecting.

5. The exposure method according to claim 1, wherein said correction amount of said movement information is determined on an assumption that of an exposure already performed on a predetermined layer, a thermal energy generated on an exposure that is performed spatially and temporally close to an exposure that performed on said divided area causes a local thermal expansion of said substrate, and a thermal energy generated on an exposure that is performed spatially and temporally far away from said exposure to be performed causes thermal expansion of said substrate in general.

6. The exposure method according to claim 1, further comprising, prior to exposure on said substrate:

sequentially transferring measurement patterns on a plurality of measurement divided areas on a measurement substrate in accordance only with designated intervals between said measurement divided areas before transferring of said measurement substrate;

cooling said measurement substrate on which said measurement patterns are transferred to a temperature prior to said transfer, and measuring distances between said measurement divided areas; and determining said correction amount of said movement information based on a result of said measurement.

7. The exposure method according to claim 1, wherein an image characteristic of a transferred image of said pattern onto said substrate is controlled based on said correction amount of said movement information.

8. The exposure method according to claim 1, wherein:

said pattern formed on said mask is transferred onto said substrate while synchronously moving said mask and said substrate, and at least one of a starting position of said mask that moves synchronously on exposure of said divided area, a starting position said substrate that moves synchronously, a synchronous velocity ratio between said mask and said substrate, a direction of said mask moving synchronously, a direction of said substrate moving synchronously, and a rotational angle of said mask around a normal to a surface which said patterns are formed, is corrected with respect to said correction amount of said movement information.

9. An exposure method that sequentially transfers a predetermined pattern on a plurality of divided areas arranged on a substrate in a shape of a matrix in a sequence that proceeds to an adjacent divided area in a first row direction of said matrix and when there is no adjacent divided area in said first row direction then goes on to an adjacent row in a column direction of said matrix and continues in a second row direction opposite to said first row direction, said exposure method comprising:

correcting a movement information of said substrate for exposure of a first divided area in a new row so as to make a correction amount of a movement amount of said substrate larger than a correction amount of a movement amount of said substrate on a preceding movement between rows, while considering thermal distortion of said substrate due to exposure already performed on said substrate prior to a movement of said substrate for exposure of said first divided area in said new row on said substrate;

adjusting a positional relationship between said mask and said substrate for exposure of said first divided area on said new row, based on said corrected movement information; and transferring a pattern onto said first divided area on said new row, after adjusting said positional relationship.

10. The exposure method according to claim 9, further comprising obtaining said movement information prior to exposure on said substrate.

11. The exposure method according to claim 10, wherein said movement information is obtained by:

detecting positional information of a plurality of predetermined alignment marks that are among a plurality of alignment marks formed on said substrate with said plurality of divided areas; and obtaining positional information of said plurality of divided areas formed on said substrate by statistical calculation based on a result of said detecting.

12. The exposure method according to claim 9, wherein a correction amount of said movement information is determined based on thermal energy generated by an exposure already performed on a predetermined layer on said substrate.

13. The exposure method according to claim 12, wherein a correction amount of said movement information is determined by a function using a number of divided areas in which exposure is already performed on said predetermined layer as a variable.

14. The exposure method according to claim 12, wherein said correction amount of said movement information is determined on an assumption that of an exposure already performed on said predetermined layer, a thermal energy generated on an exposure that is performed spatially and temporally close to an exposure to be performed on said divided area causes a local thermal expansion of said substrate, and a thermal energy generated on an exposure that is performed spatially and temporally far away from said exposure to be performed causes thermal expansion of said substrate in general.

15. The exposure method according to claim 9, further comprising, prior to exposure on said substrate:

sequentially transferring measurement patterns on a plurality of measurement divided areas on a measurement substrate in accordance only with designed intervals between said measurement divided areas before transferring of said measurement substrate;

cooling said measurement substrate on which said measurement patterns are transferred to a temperature prior to said transfer, and measuring distances between said measurement divided areas; and determining said correction amount of said movement information based on a result of said measurement.

16. The exposure method according to claim 9, wherein an image characteristic of a transferred image of said pattern onto said substrate is controlled based on said correction amount of said movement information.

17. The exposure method according to claim 9, wherein:

said pattern formed on said mask is transferred onto said substrate while synchronously moving said mask and said substrate, and at least one of a starting position of said mask that moves synchronously on exposure of said divided area, a starting position said substrate that moves synchronously, a synchronous velocity ratio between said mask and said substrate, a direction of said mask moving synchronously, a direction of said substrate moving synchronously, and a rotational angle of said mask around a normal to a surface which said patterns are formed, is corrected with respect to said correction amount of said movement information.

18. A scanning exposure method that sequentially transfers a pattern formed on a mask via a projection optical system onto a plurality of divided areas arranged on a substrate while synchronously moving said mask and said substrate, said exposure method comprising:

controlling a condition for scanning exposure on a predetermined layer in accordance with thermal energy generated by an exposure already performed on said predetermined layer on said substrate.

19. An exposure method that sequentially transfers a pattern formed on a mask onto a plurality of divided areas arranged on a substrate, said method comprising:

making a correction of a movement of said substrate on exposure of a predetermined layer on an assumption that of an exposure already performed on said predetermined layer, a thermal energy generated on an exposure that is performed spatially and temporally close to an exposure to be performed on said divided area causes a local thermal expansion of said substrate, and a thermal energy generated on an exposure that is performed spatially and temporally far away from said exposure to be performed causes thermal expansion of said substrate in general.

20. The scanning exposure method according to claim 18, wherein:

said condition includes a moving velocity ratio between said mask and said substrate when synchronously moving said mask and said substrate, and by controlling said moving velocity ratio, magnification errors in a direction of said substrate moving synchronously between a transferred image of a pattern formed on said mask and a pattern that has already been formed on said substrate are corrected.

21. The scanning exposure method according to claim 18, wherein:

said condition includes a projection magnification of said projection optical system, and by controlling said projection magnification, magnification errors in a direction perpendicular to said direction of said substrate moving synchronously between a transferred image of a pattern formed on said mask and a pattern that has already been formed on said substrate are corrected.

22. The scanning exposure method according to claim 21, wherein:

said projection magnification is controlled by using a scaling parameter representing the extension and contraction of said substrate, which parameter is among the parameters for a model function representing an arrangement of said divided areas on said substrate obtained by statistically calculating a positional information of a plurality of alignment marks that have already been formed on said substrate.

23. The scanning exposure method according to claim 22, wherein:

when said projection magnification is controlled, another condition for said scanning exposure that is different from said projection magnification is controlled simultaneously.

24. The scanning exposure method according to claim 23, wherein:

said another condition includes at least one of a movement velocity of said substrate upon said synchronous movement, intensity on said substrate of illumination beam that illuminates said mask pattern, and a width of an area that is irradiated with said illumination beam in said moving direction.

25. The scanning exposure method according claim 24, wherein:

said illumination beam is a pulse light, and said another condition includes an oscillation frequency of a light source that oscillates said pulse light.

26. The scanning exposure method according to claim 21, wherein:

a reflection type mask is used as said mask, a mask pattern formed on said reflection type mask is illuminated with extreme ultraviolet light, said mask pattern is transferred onto said substrate via said projection optical system that is structured of only reflection optical elements, and said projection magnification is controlled by moving said reflection type mask along an axis perpendicular to a plane on which a mask pattern is formed.

27. A device manufacturing method including a lithographic process, wherein said lithographic process uses the exposure method of claim 1 to transfer a predetermined pattern onto a divided area on a substrate.

28. A device manufacturing method including a lithographic process, wherein said lithographic process uses the exposure method of claim 9 to transfer a predetermined pattern onto a divided area on a substrate.

* * * * *

UNITED STATES PATENT AND TRADEMARK OFFICE
CERTIFICATE OF CORRECTION

PATENT NO.    : 6,699,630 B2
DATED         : March 2, 2004
INVENTOR(S)   : Ota

It is certified that error appears in the above-identified patent and that said Letters Patent is hereby corrected as shown below:

Title page,
Item [63], Related U.S. Application Data, should read -- (63) Continuation of application No. 09/612,495, filed on Jul. 7, 2000, now abandoned. --

Signed and Sealed this

Eighteenth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,699,630 B2
DATED         : March 2, 2004
INVENTOR(S)   : Kazuya Ota It is certified that error appears in the above-identified patent and that said Letters Patent is hereby corrected as shown below:

Title page,
Item [56], References Cited, U.S. PATENT DOCUMENTS, add the following items:

-- U.S. PATENT DOCUMENTS 5,834,785     11/10/98     Coon    250    492.2

FOREIGN PATENT DOCUMENTS
4-96315   3/27/1992     JAPAN (w/English Abstract) Translation - Yes --

Signed and Sealed this

Third Day of August, 2004

JON W. DUDAS
*Acting Director of the United States Patent and Trademark Office*